(12) United States Patent
Chiba et al.

(10) Patent No.: US 10,118,770 B2
(45) Date of Patent: Nov. 6, 2018

(54) ELECTRONIC COMPONENT MOUNTER AND ELECTRONIC COMPONENT MOUNTING SYSTEM

(71) Applicant: Panasonic Intellectual Property Management Co., Ltd., Osaka (JP)

(72) Inventors: Gouki Chiba, Osaka (JP); Toshihiko Nagaya, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 186 days.

(21) Appl. No.: 15/351,587

(22) Filed: Nov. 15, 2016

(65) Prior Publication Data

US 2017/0174438 A1 Jun. 22, 2017

(30) Foreign Application Priority Data

Dec. 22, 2015 (JP) .................................. 2015-250153
Dec. 22, 2015 (JP) .................................. 2015-250154

(51) Int. Cl.
*B65G 43/02* (2006.01)
*H05K 13/04* (2006.01)
*B65G 23/44* (2006.01)

(52) U.S. Cl.
CPC ......... *B65G 43/02* (2013.01); *H05K 13/0417* (2013.01); *B65G 23/44* (2013.01); *B65G 2203/0275* (2013.01); *B65G 2203/041* (2013.01)

(58) Field of Classification Search
CPC ........ B65G 23/44; B65G 43/02; B65G 43/06; B65G 2203/0275; B65G 2203/041; B65G 2207/48; H05K 13/0417
USPC .......................... 198/810.02, 810.03, 810.04
See application file for complete search history.

(56) References Cited

U.S. PATENT DOCUMENTS

| | | | | |
|---|---|---|---|---|
| 7,894,934 B2* | 2/2011 | Wallace | ................. | B65G 43/00 198/341.01 |
| 8,330,452 B2* | 12/2012 | Furukawa | .............. | B65G 43/04 198/444 |
| 9,284,129 B2* | 3/2016 | Sakaguchi | ............. | B65G 43/02 |
| 9,988,217 B2* | 6/2018 | Hou | ....................... | B65G 43/02 |
| 2003/0000808 A1* | 1/2003 | Kusel | ..................... | B65G 43/02 198/502.1 |

FOREIGN PATENT DOCUMENTS

JP 2014-041864 3/2014
JP 2014041864 A * 3/2014

* cited by examiner

*Primary Examiner* — Gene O Crawford
*Assistant Examiner* — Keith R Campbell
(74) *Attorney, Agent, or Firm* — Pearne & Gordon LLP

(57) ABSTRACT

An electronic component mounter having a mounting head includes: a board transporter (transport mechanism) that transports a board with a transport belt supporting the board; a recognizer (a board recognition camera or a height sensor) that is provided in the mounting head and recognizes a state of a front surface of the transport belt; and a determiner (wear determiner) that determines a degradation state (wear degree) of the transport belt based on the state of the front surface of the transport belt recognized by the recognizer.

12 Claims, 18 Drawing Sheets

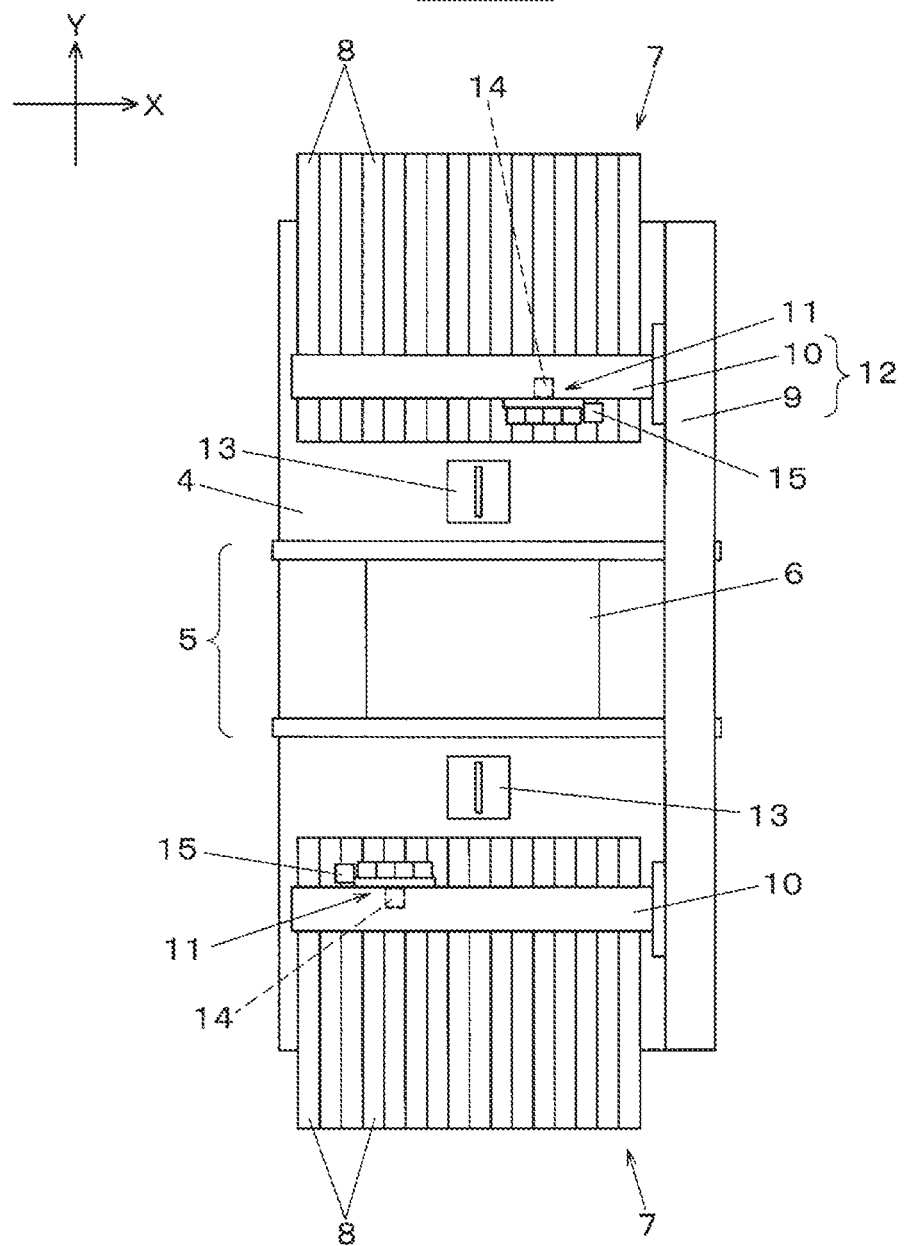

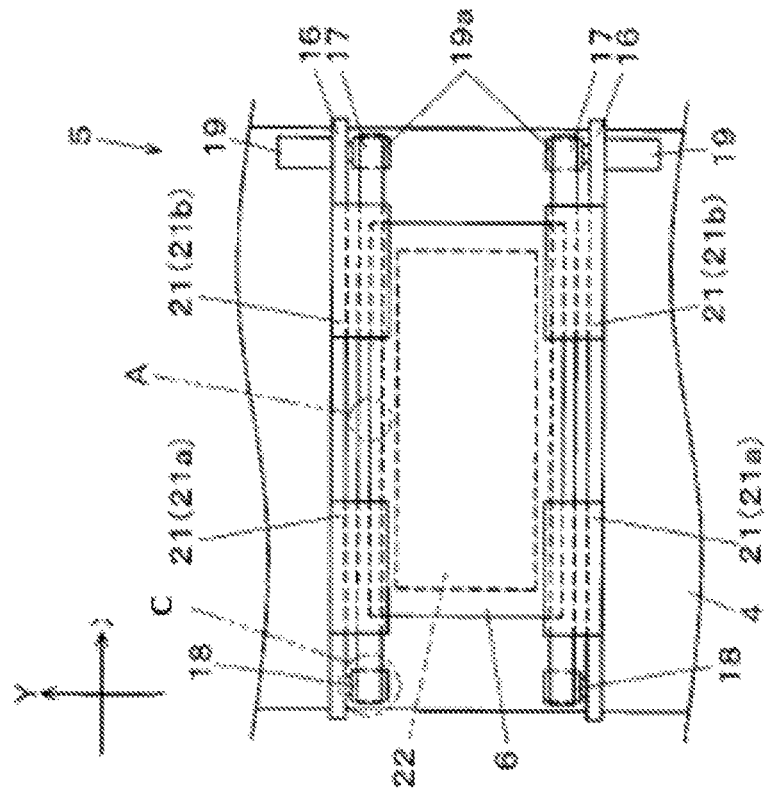
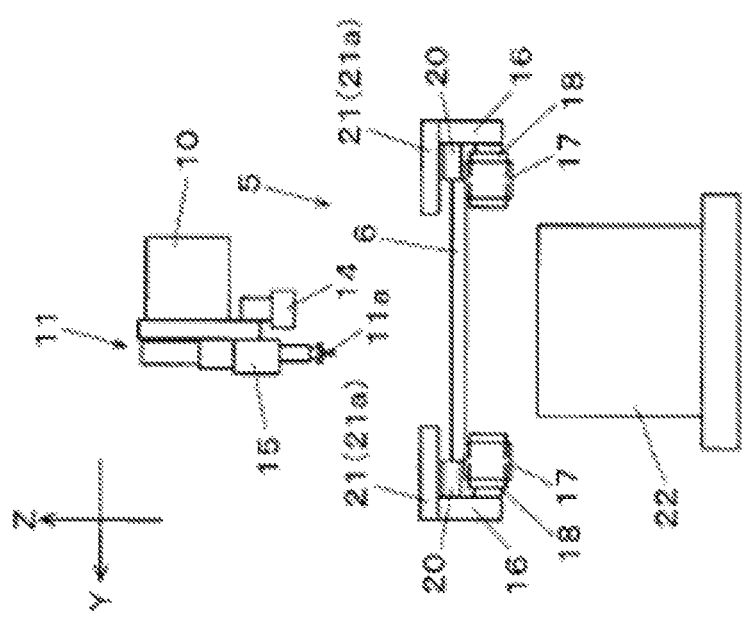

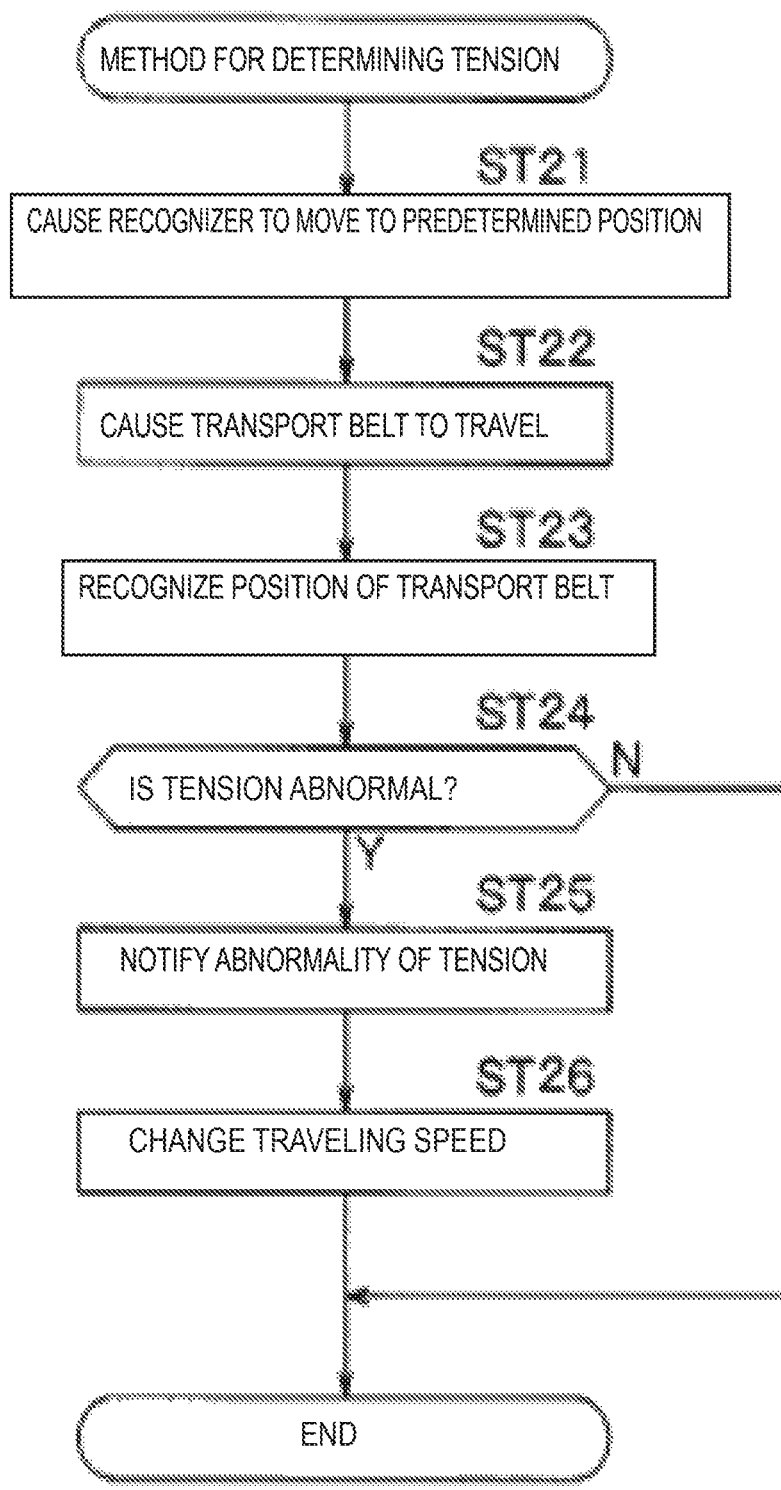

ELECTRONIC COMPONENT MOUNTER AND ELECTRONIC COMPONENT MOUNTING SYSTEM

BACKGROUND

1. Technical Field

The present invention relates to an electronic component mounter and an electronic component mounting system in which time degradation state of a transport belt, which is installed, is monitored.

2. Description of the Related Art

In an electronic component mounter that is used in an electronic component mounting system which mounts an electronic component on a substrate, a transport mechanism that transports the board by using a horizontally traveling transport belt is often used. The transport belt is formed of polyurethane or the like, the transport belt elongates due to time degradation occurring while in use, or a front surface thereof, which supports the board, is worn. When the transport belt is worn more than a predetermined amount due to the time degradation, there is a concern that it is not possible for the board to stop at a predetermined position due to an occurrence of slip of the board, which is transported, or it is not possible to transport the board. As a method of monitoring the time degradation of the transport belt, there is known, for example, a method in which an electronic component mounter is provided with a sensor that detects tension of a transport belt such that the tension of the transport belt is measured (refer to Japanese Patent Unexamined Publication No. 2014-41864).

CITATION LIST

Patent Literature

PTL 1: Japanese Patent Unexamined Publication No. 2014-41864

SUMMARY

According to the disclosure, there is provided an electronic component mounter having a mounting head that mounts an electronic component on a board, the electronic component mounter including: a board transporter that transports the board with a transport belt supporting the board; a recognizer for recognizing a state of a front surface of the transport belt, the a recognizer being provided in the mounting head; and determiner for determining a degradation state of the transport belt based on the state of the front surface of the transport belt recognized by the recognizer.

According to the disclosure, there is provided an electronic component mounting system including an electronic component mounter having a mounting head that mounts an electronic component on a board. In the electronic component mounting system, the electronic component mounter includes a board transporter that transports the board with a transport belt supporting the board; a recognizer for recognizing a state of a front surface of the transport belt, a recognizer being provided in the mounting head; and a determiner for determining a degradation state of the transport belt based on the state of the front surface of the transport belt recognized by the recognizer.

According to the disclosure, it is possible to monitor a degradation state of the transport belt which is in a state of being installed in the electronic component mounter.

BRIEF DESCRIPTION OF THE DRAWINGS

FIG. 2 is a plan view of an electronic component mounter of another exemplary embodiment of the disclosure;

FIG. 3A is a diagram depicting a configuration of a transport mechanism provided in the electronic component mounter of the exemplary embodiment of the disclosure;

FIG. 3B is a diagram depicting the configuration of the transport mechanism provided in the electronic component mounter of the exemplary embodiment of the disclosure;

FIG. 16 is a diagram depicting a process of a component mounting method performed by the electronic component mounting system and the electronic component mounter of the exemplary embodiment of the modification example of the disclosure;

DETAILED DESCRIPTIONS

Before an exemplary embodiment of the disclosure is described, a problem in the related art is briefly described.

In the related art including Japanese Patent Unexamined Publication No. 2014-41864, a degradation state of a transport belt due to time degradation occurring while the belt is in use is confirmed by maintenance staff who visually observes the transport belt and qualitatively determines a state of the transport belt at a timing of maintenance checkup or the like, or, in order to quantitatively determine the state of the transport belt, there is a need to dismount the transport belt from the electronic component mounter and analyzes the transport belt with a dedicated device. Therefore, a problem arises in that it is not possible to quantitatively monitor the degradation state of the transport belt that is in a state of being installed in the electronic component mounter.

Hence, an object of the disclosure is to provide an electronic component mounter and an electronic component mounting system, in which it is possible to monitor a degradation state of a transport belt that is in a state of being installed in the electronic component mounter.

Hereinafter, an exemplary embodiment of the disclosure will be described below in detail with reference to the figures. A configuration, a shape, or the like, which will be described below, is an example for description, and can be appropriately modified according to specification of the electronic component mounting system. Hereinafter, the same reference signs are assigned to corresponding elements in all of the figures, and repeated description thereof is omitted. In FIG. 2 and a part of the following description, an X direction as a board transporting direction (rightward-leftward direction in FIG. 2), and a Y direction orthogonal to the board transporting direction (frontward-rearward direction in FIG. 2) are illustrated as two axial directions which are orthogonal to each other in a horizontal plane. In FIG. 3A and a part of the following description, a Z direction is illustrated as a height direction orthogonal to the horizontal plane. The Z direction is a vertical direction or an orthogonal direction in a case where the electronic component mounting system is disposed on the horizontal plane.

Figure 1:
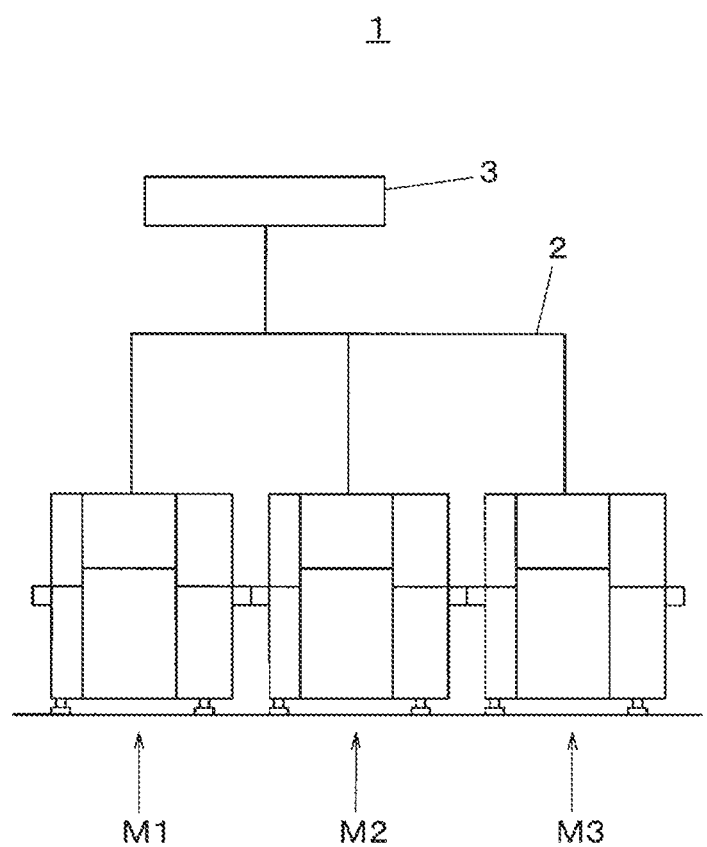
FIG. 1 is a diagram depicting a configuration of an electronic component mounting system of an exemplary embodiment of the disclosure.

First, electronic component mounting system 1 is described with reference to FIG. 1. Electronic component mounting system 1 in FIG. 1 has a configuration in which electronic component mounters M1 to M3 are interlinked and connected via communication network 2, and the entire system is controlled by supervisory computer 3. In other words, electronic component mounting system 1 includes electronic component mounters M1 to M3. Electronic component mounting system 1 has a function of mounting an electronic component (hereinafter, simply referred to as a "component") on a board and manufacturing a mounting board. Note that the configuration of electronic component mounting system 1 is not limited to an example in FIG. 1, and the electronic component mounting system may be configured to interlink four or more electronic component mounters, or may be configured of one electronic component mounter.

Next, a configuration of electronic component mounters M1 to M3 will be described with reference to FIG. 2. Electronic component mounters M1 to M3 have the same configuration, and, here, electronic component mounter M1 is described. Electronic component mounter M1 has a function of performing component mounting operation of mounting a component supplied from a component supplier on a board by a mounting head. Transport mechanism 5 is disposed at the center of base 4 in the X direction.

Transport mechanism 5 loads and holds by positioning board 6 transported from the upstream side at a mounting operation position. In addition, transport mechanism 5 unloads board 6, on which the component mounting operation is completed, to the downstream side from the mounting operation position.

Component suppliers 7 are disposed on both sides of transport mechanism 5. A plurality of tape feeders 8 are installed in parallel on each of component suppliers 7. Tape feeder 8 performs feeds, by pitch, a carrier tape, on which a pocket that accommodates a component is formed, in a direction (tape feeding direction) toward transport mechanism 5 from an outer side of component supplier 7, thereby supplying the component to a component suction position by a mounting head of a component mounting mechanism which will be described below.

Y-axis beam 9 provided with a linear drive mechanism is disposed at an end portion on one side of the X direction in the top surface of base 4. Two X-axis beams 10 provided, similarly, with linear drive mechanisms are joined to Y-axis beam 9 so as to move freely in the Y direction. Mounting heads 11 are installed in two X-axis beams 10, respectively, so as to move freely in the X direction. Mounting head 11 are multi-connection type head including a plurality of holding heads, and, as illustrated in FIG. 3A, suction nozzle 11a, which sucks and holds the component and is individually capable of being lifted and lowered, is installed. Suction nozzles 11a communicate with a negative pressure generating source and a positive pressure generating source via solenoid valve 11b (refer to FIG. 5). Control of solenoid valve 11b causes suction nozzles 11a to vacuum-suck the component and suction nozzles 11a to perform blasting with air.

Drive of Y-axis beam 9 and X-axis beam 10 enables mounting heads 11 to move in the X direction and the Y direction. In other words, Y-axis beam 9 and X-axis beam 10 configure head moving mechanism 12 that causes mounting heads 11 to move in the horizontal plane. Thus, two mounting heads 11 pick up the components by suction nozzles 11a from component suction positions of tape feeders 8 of component suppliers 7, respectively, and carry and place the components to mounting points of board 6 positioned on transport mechanism 5. Y-axis beam 9, X-axis beam 10, and mounting heads 11 configure the component mounting mechanism that causes mounting head 11 holding the component to move, thereby carrying and placing the component on board 6. In this manner, electronic component mounter M1 includes mounting head 11 that carries and places (mounts) the component (electronic component) on board 6.

In FIG. 2, component recognition camera 13 is disposed between component supplier 7 and transport mechanism 5. When mounting head 11 moves over component recognition camera 13 after picking up the component from component supplier 7, component recognition camera 13 images the component which is in a state of being held by mounting head 11. Board recognition cameras 14 that move integrally to mounting heads 11, respectively, are installed on mounting heads 11 so as to be positioned on the underside of X-axis beam 10. The movement of mounting head 11 causes board recognition camera 14 to move over board 6 positioned and held in transport mechanism 5 and to image board 6. In addition, board recognition camera 14 moves over a transport belt, to be descried below, which is installed in transport mechanism 5 and images a state of a front surface of the transport belt.

Imaging data obtained by component recognition camera 13 and board recognition camera 14 is subjected to a recognition process in recognition processor 31c (refer to FIG. 5) of mounting controller 31. In addition, in the component mounting operation on board 6 by mounting head 11, placement position correction is performed by combining a recognition result of the component by component recognition camera 13 and a recognition result of the board by board recognition camera 14.

In FIG. 2, height sensor 15 that moves integrally to mounting head 11 is installed on one side surface of each of mounting heads 11. Height sensor 15 is a laser displacement sensor that detects a laser beam with which a measurement target is irradiated and which is reflected from the target, and that measures a distance from the measurement target. Height sensor 15 performs irradiation with a line-shaped laser beam, thereby making it possible to measure height H of the measurement target or level difference ΔH in the measurement target. Height sensor 15 moves over board 6 positioned and held on transport mechanism 5 and measures the height of the component mounted on board 6. In addition, height sensor 15 moves over the transport belt installed in transport mechanism 5 and measures height H of the front surface of the transport belt or level difference ΔH on the front surface of the transport belt.

Next, a configuration of transport mechanism 5 will be described with reference to FIGS. 3A to 4B. FIG. 3A schematically illustrates a side of transport mechanism 5 and mounting head 11 moving over transport mechanism 5 when viewed from the upstream side of a board transporting direction (X direction), and FIG. 3B schematically illustrates a plan view of transport mechanism 5 viewed from above. Transport mechanism 5 includes a pair of transport belts 17 disposed in the X direction on inner sides of a pair of plate-shaped member 16 extending in the X direction. Transport belt 17 loops over pulley 18 disposed at an end of plate-shaped member 16 and over drive pulley 19a that is driven by transport motor 19 disposed at the other end.

In FIG. 3A, guide members 20, which project over transport belts 17, respectively, are disposed on the inner sides of the pair of plate-shaped member 16. The pair of guide members 20 come into contact with both side surfaces of board 6 that is transported by transport belt 17, and guide board 6 such that an underside of board 6 is supported by a substantially half region of transport belt 17 in its width direction. In other words, the pair of transport belts 17 support board 6 on upper surfaces (hereinafter, referred to as "support surface 17a") on inner sides of the belts, and do not support board 6 on upper surfaces (hereinafter, referred to as "non-support surface 17b") on outer sides of the belts (refer to FIGS. 4A and 4B). Transport belts 17 horizontally move along plate-shaped members 16 by synchronous drive of two transport motors 19, and transport, in the X direction, board 6 loaded on the upper surface. In other words, transport mechanism 5 is a board transporter that supports board 6 by transport belt 17 and transports board 6.

In FIG. 3A, press plates 21, which project above transport belts 17, respectively, are disposed on upper ends of the pair of plate-shaped members 16. A gap between an underside of press plate 21 and the upper surface of transport belt 17 is wider than a thickness of board 6 that is transported by transport belt 17. Lower reception member 22, which is lifted and lowered by a lifting and lowering device (not illustrated), is disposed below board 6 at a mounting operation position. Press plate 21 presses both edges of board 6 raised from transport belt 17 by lifting lower reception member 22, with an underside of press plate 21, thereby holding board 6 at the mounting operation position.

In FIG. 3B, press plate 21 is configured of press plate 21a on the upstream side and press plate 21b on the downstream side. In addition, guide member 20 is not disposed in region A shown in a circle of a two-dot chain line between press plate 21a on the upstream side and press plate 21b on the downstream side. Therefore, it is possible to image the state of the front surface of transport belt 17 by board recognition camera 14 moving over region A. In addition, it is possible to measure height H of the front surface of transport belt 17 by height sensor 15 moving over region A. For the convenience, in FIG. 3B, guide member 20 is not depicted.

Figure 4A:
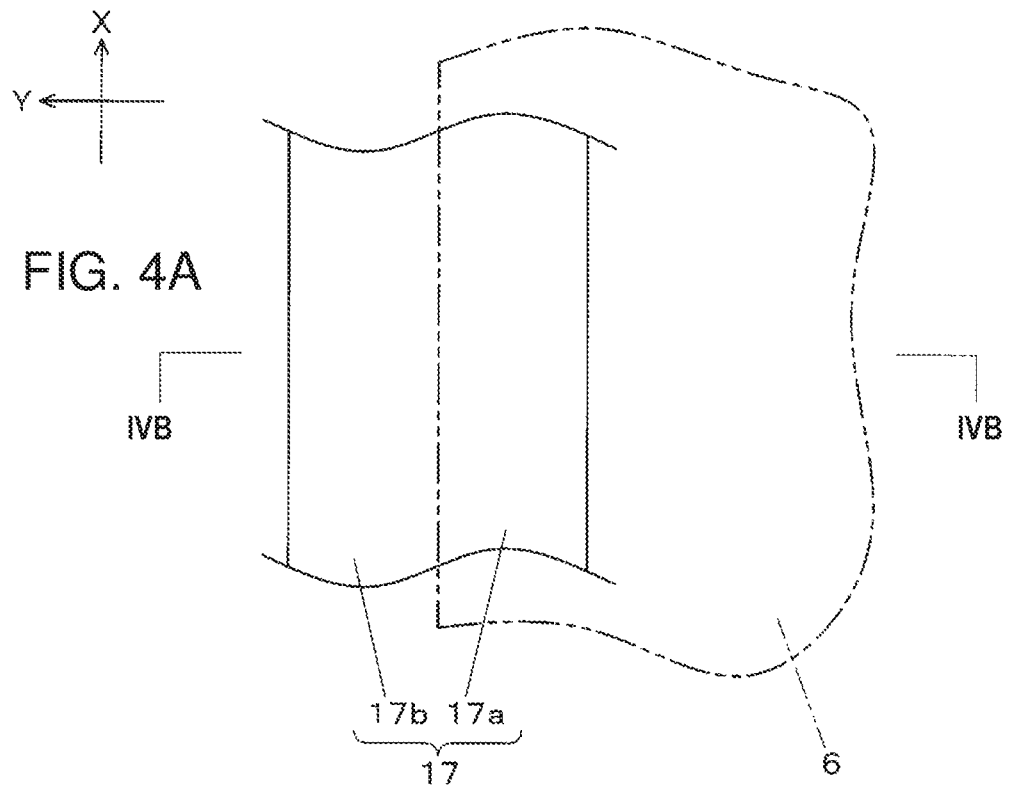
FIG. 4A is an enlarged plan view of a transport belt installed in the transport mechanism provided in the electronic component mounter of the exemplary embodiment of the disclosure.
Figure 4B:
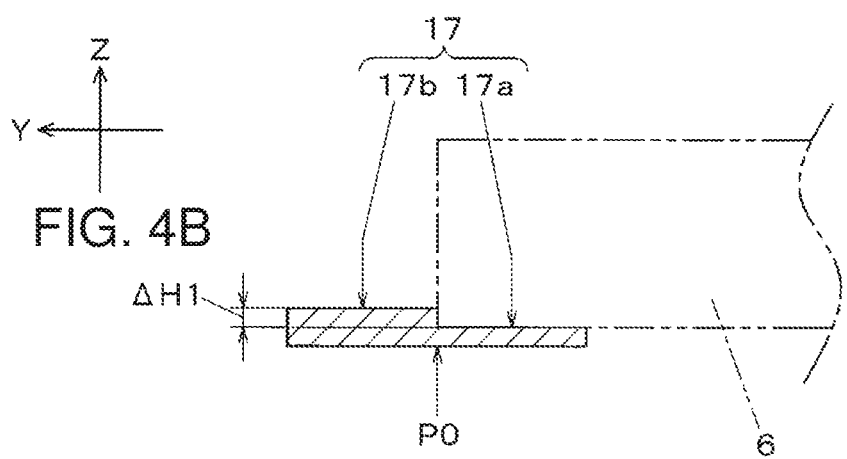
FIG. 4B is an enlarged sectional view of the transport belt installed in the transport mechanism provided in the electronic component mounter of the exemplary embodiment of the disclosure.

FIG. 4A is an enlarged view of transport belt 17 in region A illustrated in FIG. 3B. FIG. 4B illustrates a sectional view taken along line IVB-IVB illustrated in FIG. 4A. On transport belt 17, board 6 is supported by support surface 17a and is not supported by non-support surface 17b. Therefore, only support surface 17a of transport belt 17 is gradually worn due to temporal change while being in use. FIG. 4B illustrates a wear state of support surface 17a of transport belt 17 due to the temporal change.

The front surface of transport belt 17 has level difference ΔH1 at boundary position P0 between non-support surface 17b and support surface 17a.

Next, a control system of electronic component mounting system 1 will be described with reference to FIG. 5. Electronic component mounters M1 to M3 have the same configuration, and, here, electronic component mounter M1 is described. Electronic component mounter M1 includes mounting controller 31, mounting storage 32, transport mechanism 5, component supplier 7, mounting head 11, head moving mechanism 12, component recognition camera 13, board recognition camera 14, height sensor 15, display 33, and communicator 34. Mounting storage 32 stores various items of data such as image data 32a, luminance data 32b, or height data 32c, as well as mounting operation parameters required for control of the configurational members by mounting controller 31.

Figure 5:
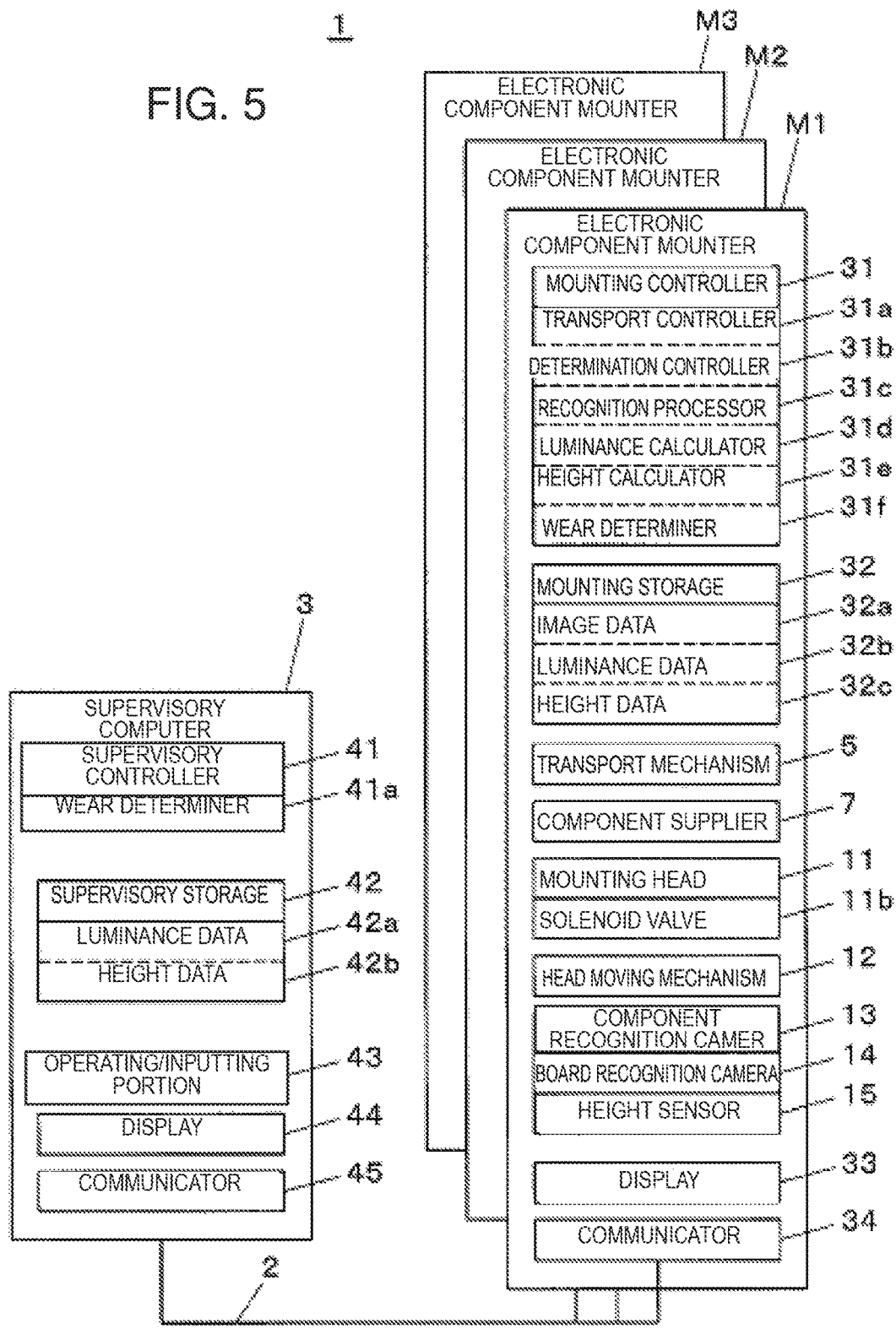
FIG. 5 is a block diagram illustrating a configuration of a control system of the electronic component mounting system of the exemplary embodiment of the disclosure.

In FIG. 5, mounting controller 31 includes transport controller 31a as an internal processing function, determination controller 31b, recognition processor 31c, luminance calculator 31d, height calculator 31e, and wear determiner 31f. Mounting controller 31 controls the configurational members of component supplier 7, mounting head 11, and head moving mechanism 12, thereby performing component mounting operation of picking up a component from component supplier 7 so as to carry and place the component on board 6 positioned and held at the mounting operation position by transport mechanism 5. Transport controller 31a controls transport mechanism 5 such that board 6 is loaded and held at the mounting operation position and is unloaded from the mounting operation position. Determination controller 31b collectively performs a wear determining process which will be described below.

Figure 6A:
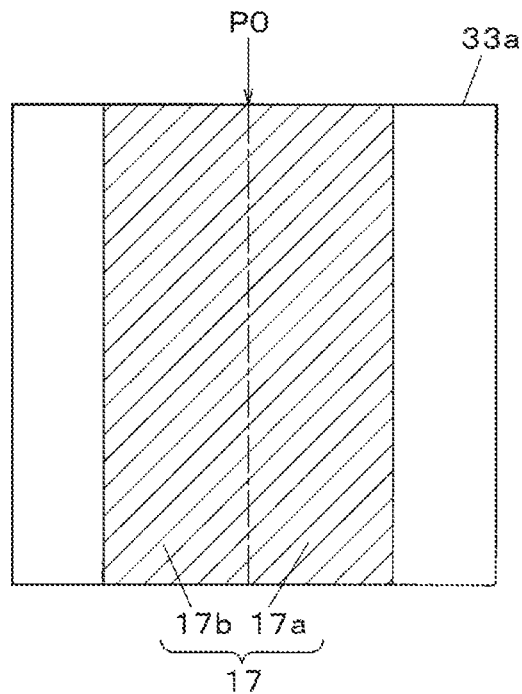
FIG. 6A is a view illustrating an example of an image that shows a state in which a front surface of the transport belt installed in the transport mechanism is not worn and that is imaged by a board recognition camera provided in the electronic component mounter of the exemplary embodiment of the disclosure.
Figure 6B:
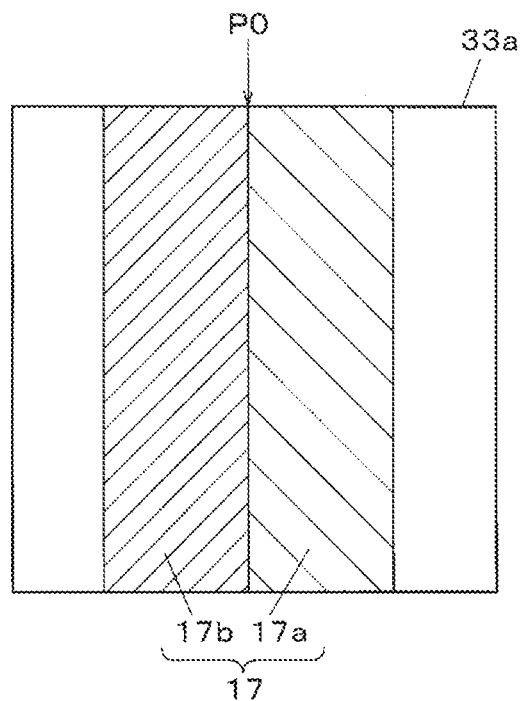
FIG. 6B is a view illustrating an example of an image that shows a state in which the front surface of the transport belt installed in the transport mechanism is worn and that is imaged by the board recognition camera provided in the electronic component mounter of the exemplary embodiment of the disclosure.

Recognition processor 31c performs the recognition process on imaging data imaged by component recognition camera 13 and board recognition camera 14 and stores the processed data as image data 32a in mounting storage 32. Here, with reference to FIGS. 6A and 6B, there is provided description of an example of image data 32a of a state of the front surface of transport belt 17 imaged by board recognition camera 14, which is displayed on display screen 33a of display 33. FIGS. 6A and 6B are captured images of region A illustrated in FIG. 3B.

FIG. 6A illustrates an example of a state of the front surface of transport belt 17 that is not degraded immediately after the belt is installed in transport mechanism 5, and there is no level difference between support surface 17a and non-support surface 17b of transport belt 17. FIG. 6B illustrates an example of a state of the front surface of transport belt 17 (corresponding to FIG. 4B) having support surface 17a that supports board 6 and is worn due to time degradation. When support surface 17a of transport belt 17 becomes a coarse surface and irregularity is increased due to wear, a light beam is likely to be diffusely reflected. Therefore, luminance B (contrasting density of an image) of support surface 17a is increased in image data 32a (the light beam is diffusely reflected and the surface looks bright). Accordingly, support surface 17a and non-support surface 17b of transport belt 17 have a difference in luminance B (hereinafter, referred to as "luminance difference ΔB").

In FIG. 5, luminance calculator 31d calculates luminance B of or luminance difference ΔB between support surface 17a and non-support surface 17b of transport belt 17 from stored image data 32a of transport belt 17 and stores the luminance or the luminance difference as luminance data 32b in mounting storage 32. Height calculator 31e computes a measurement result of the front surface of transport belt 17 by height sensor 15 such that height H or level difference ΔH of a predetermined position is calculated and is stored as height data 32c in mounting storage 32.

Figure 7:
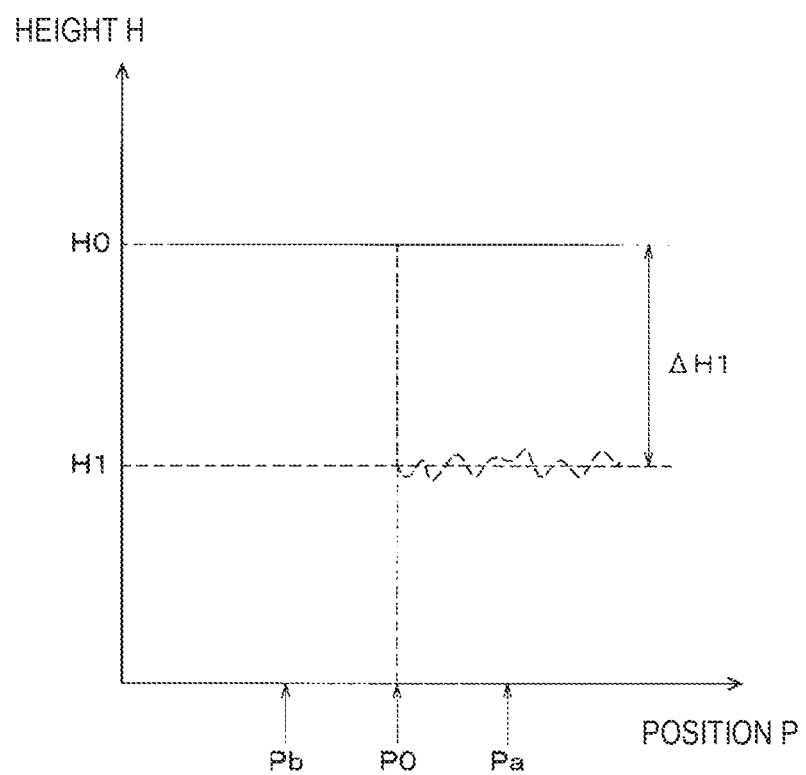
FIG. 7 is a diagram illustrating an example of a result obtained by measuring, using a height sensor, the front surface of the transport belt installed in the transport mechanism provided in the electronic component mounter of the exemplary embodiment of the disclosure.

Here, height H of the front surface of transport belt 17, which is calculated by height calculator 31e, is described with reference to FIG. 7. FIG. 7 is a graph illustrating a measured result of region A illustrated in FIG. 3B by height sensor 15, in which the horizontal axis represents a position P on transport belt 17, and the vertical axis represents height H. Position P0 represented on the horizontal axis is a boundary position between support surface 17a and non-support surface 17b of transport belt 17 (also refer to FIG. 4B), the right side is support surface 17a (position Pa represents a representative point thereof), and the left side is non-support surface 17b (position Pb represents a representative point thereof), with position P0 interposed therebetween. A solid line in the graph illustrates an example of a measurement result of height H of the front surface of transport belt 17 immediately after the transport belt is installed in transport mechanism 5. A dotted line in the graph illustrates an example of a measurement result of height H of the front surface of transport belt 17 (corresponding to FIG. 4B) having support surface 17a that supports board 6 and is worn due to the time degradation.

Both support surface 17a and non-support surface 17b of transport belt 17 have the same height H0 immediately after transport belt 17 is installed in transport mechanism 5. By contrast, only support surface 17a of transport belt 17 is worn due to the time degradation, and thus non-support surface 17b has height H0 without change, but support surface 17a has average height H1 lower than height H0. In other words, level difference ΔH1 (ΔH1=H0−H1) is formed between support surface 17a and non-support surface 17b. As transport belt 17 is worn, average height H1 of support surface 17a is lowered and level difference ΔH1 is increased. Height calculator 31e calculates, as height data 32c, height H0 of non-support surface 17b and average height H1 of support surface 17a or calculates level difference ΔH1 between support surface 17a and non-support surface 17b and the heights and the level difference is stored.

In FIG. 5, wear determiner 31f performs the wear determining process of determining wear degree W (degradation state) of the front surface of transport belt 17, based on luminance B of the front surface of transport belt 17 in luminance data 32b stored in mounting storage 32, or height H of the front surface of transport belt 17 in height data 32c. In addition, wear determiner 31f determines that transport belt 17 is degraded when wear degree W exceeds a threshold value (a predetermined state), and causes display 33 to perform notification of an indication that maintenance such as replacement of transport belt 17 needs to be performed. Note that wear determiner 31f may cause an indicating lamp, a buzzer, or the like (not illustrated) to perform notification.

Display 33 is a display device such as a liquid crystal panel and displays information or the like indicating the maintenance of transport belt 17, of which an operator is notified, as well as various items of data such as image data 32a, luminance data 32b, or height data 32c. Communicator 34 is a communication interface and transmits and receives a signal or data to and from supervisory computer 3 via communication network 2.

In FIG. 5, supervisory computer 3 includes supervisory controller 41, supervisory storage 42, operating/inputting portion 43, display 44, and communicator 45. Supervisory controller 41 is an arithmetic device such as a CPU, and includes an internal processor such as wear determiner 41a. Supervisory storage 42 is a storage device, and stores luminance data 42a, height data 42b, or the like, as well as electronic component mounting data that is used to collectively control electronic component mounting system 1.

Operating/inputting portion 43 is an inputting device such as a keyboard, a touch panel, or a mouse, and is used when an operating command or data is input. Display 44 is a display device such as a liquid crystal panel and displays information or the like indicating the maintenance of transport belt 17, of which an operator is notified, as well as various items of data such as luminance data 42a, or height data 42b. Communicator 45 is a communication interface and transmits and receives a signal or data to and from electronic component mounters M1 to M3 via communication network 2.

Luminance data 42a stored in supervisory storage 42 is the same as luminance data 32b stored in mounting storage 32 of electronic component mounters M1 to M3, and is transmitted by luminance calculator 31d. Height data 42b stored in supervisory storage 42 is the same as height data 32c stored in mounting storage 32 of electronic component mounters M1 to M3, and is transmitted by height calculator 31e.

Wear determiner 41a performs the same wear determining process as wear determiner 31f of electronic component mounters M1 to M3. Wear determiner 41a determines wear degree W (degradation state) of the front surface of transport belt 17, based on luminance B of the front surface of transport belt 17 in luminance data 42a stored in supervisory storage 42, or height H of the front surface of transport belt 17 in height data 42b. In addition, wear determiner 41a determines that transport belt 17 is degraded when wear degree W exceeds a threshold value (a predetermined state), and causes display 44 to perform notification of an indication that maintenance such as replacement of transport belt 17 needs to be performed.

Note that wear determiner 41a may cause an indicating lamp, a buzzer, or the like (not illustrated) to perform notification.

Figure 8:
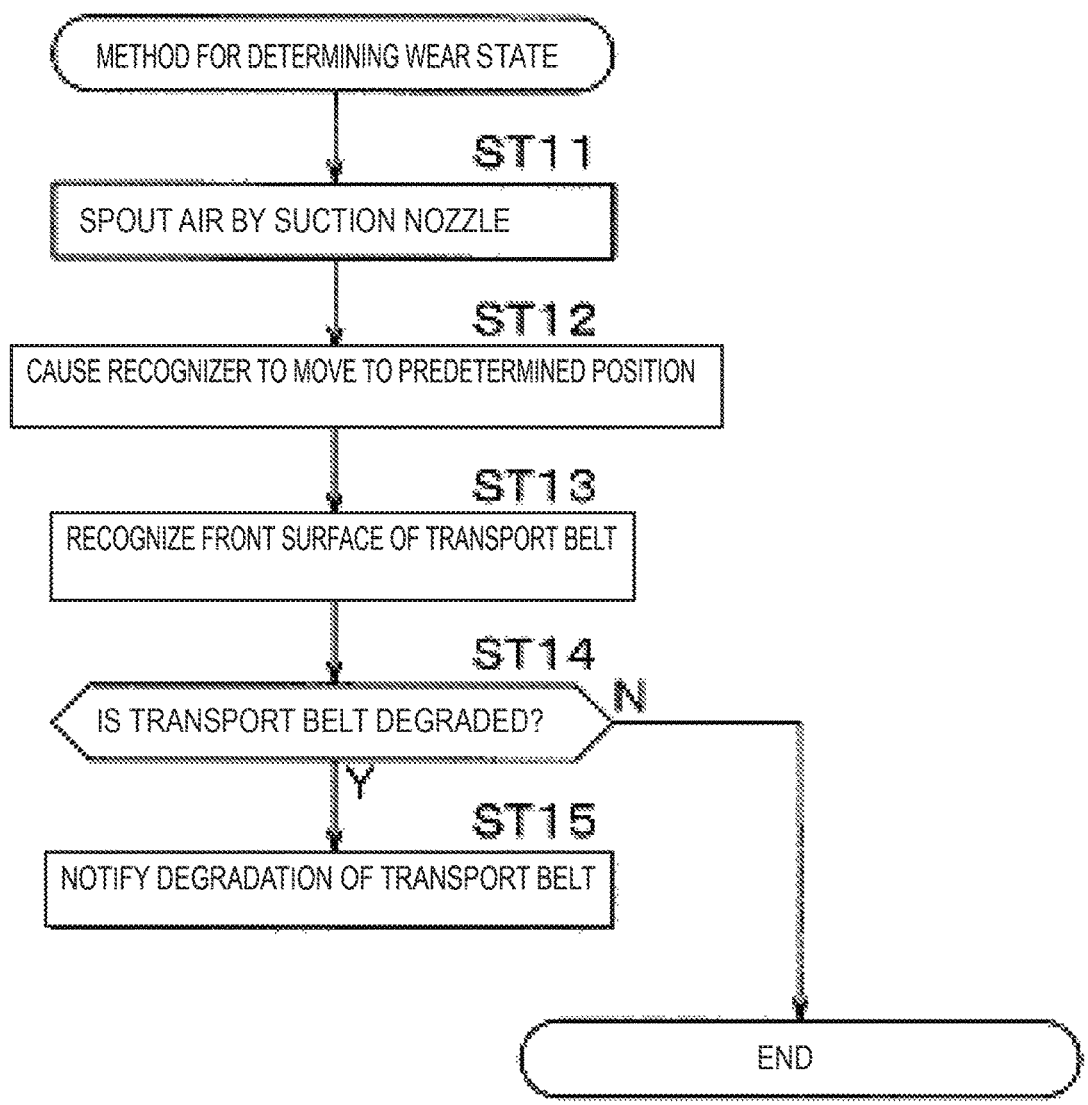
FIG. 8 is a diagram depicting a process of a component mounting method performed by the electronic component mounting system and the electronic component mounter of the exemplary embodiment of the disclosure.
Figure 9:
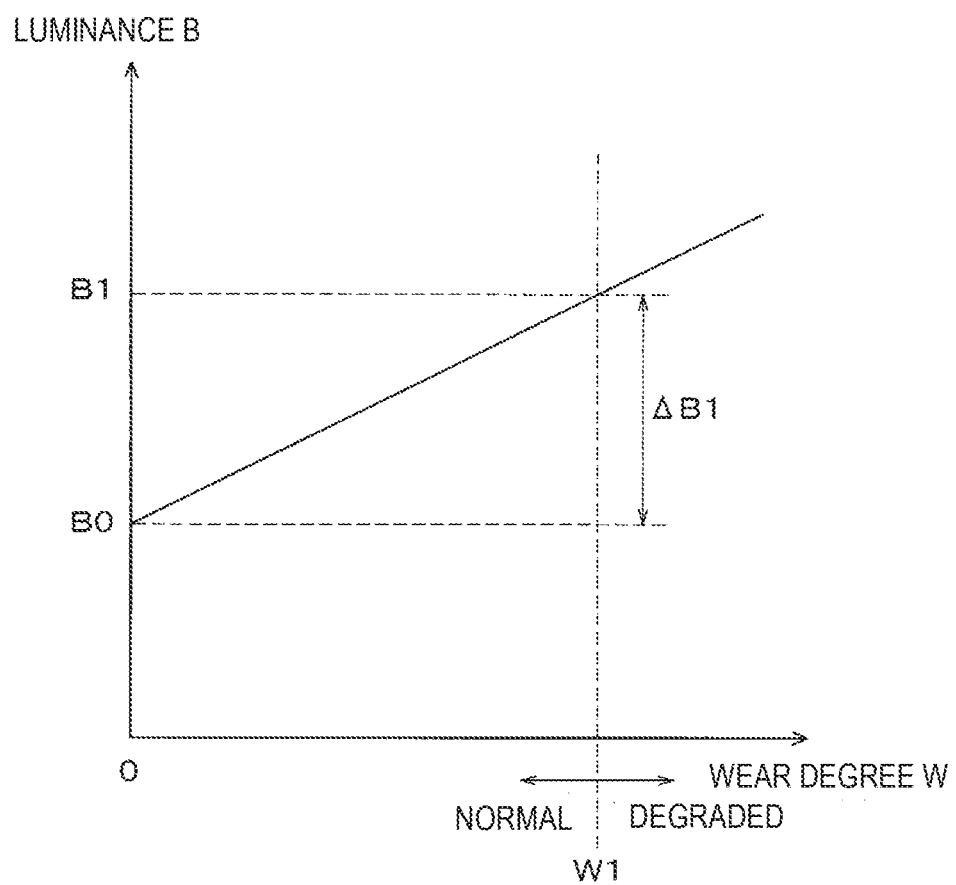
FIG. 9 is a diagram illustrating a relationship between luminance and wear degree of the front surface of the transport belt installed in the transport mechanism, and that is imaged by the board recognition camera provided in the electronic component mounter of the exemplary embodiment of the disclosure.
Figure 10:
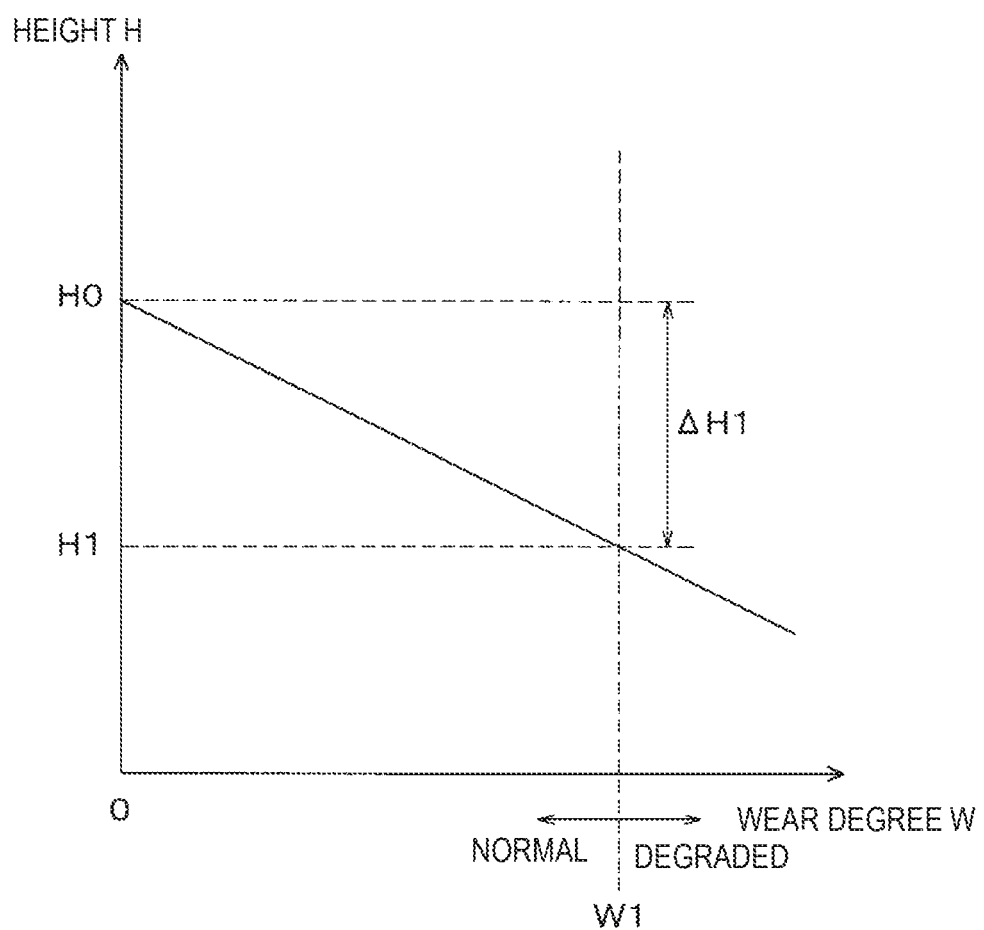
FIG. 10 is a diagram illustrating a relationship between a height and the wear degree of the front surface of the transport belt installed in the transport mechanism, and that is measured by the height sensor provided in the electronic component mounter of the exemplary embodiment of the disclosure.

Next, a method (wear determining process) for determining the wear state (wear degree W) of transport belt 17 by electronic component mounting system 1 or electronic component mounters M1 to M3 is descried in accordance with a flow in FIG. 8, with reference to FIGS. 9 and 10. The wear determining process performed by electronic component mounting system 1 and the wear determining process performed by electronic component mounters M1 to M3 are the same except that the wear determining processes are performed by different configuration members of the controller (wear determiner 41a or wear determiner 31f) and the notifier (display 44 or display 33). Hereinafter, the wear determining process by electronic component mounter M1 will be described.

The wear determining process is performed with transport belt 17 stopped at a predetermined time such as before start or after end of production, when board 6 is not loaded on transport belt 17. Board recognition camera 14 or height sensor 15 (recognizer) is used in the wear determining process. Hereinafter, an example, in which board recognition camera 14 recognizes region A of transport belt 17 illustrated in FIG. 3B and degradation due to wear is determined, will be described.

First, in the wear determining process, air is blasted to region A of transport belt 17 as the recognition target such that dust or the like attached on the front surface of transport belt 17 is blown off (ST11: dust removing process). In other words, determination controller 31b controls head moving mechanism 12 such that suction nozzle 11a of mounting head 11 is caused to move over region A of transport belt 17, and the determination controller controls solenoid valve 11b such that air is spouted from suction nozzle 11a.

In this manner, before the recognizer (board recognition camera 14 or height sensor 15) recognizes the state of the front surface of the transport belt, suction nozzle 11a (nozzle) spouts air to the front surface of transport belt 17 that is recognized. Accordingly, it is possible to prevent an erroneous determination of degradation due to wear dust attached to transport belt 17. Note that the nozzle, which spouts the air, is not limited to suction nozzle 11a; and a nozzle dedicated to removing of dust, which spouts air, may be provided in mounting head 11.

Next, determination controller 31b controls head moving mechanism 12 such that board recognition camera 14 is caused to move over region A of transport belt 17 as the recognition target (ST12; recognizer moving process). Subsequently, board recognition camera 14 performs recognition of the state of the front surface of transport belt 17 (ST13; recognition process).

Specifically, recognition processor 31c performs a recognition process on the imaging data of transport belt 17 including support surface 17a imaged by board recognition camera 14 and stores the processed imaging data as image data 32a. In other words, board recognition camera 14 (camera) is the recognizer that images the state of the surface of transport belt 17. Subsequently, luminance calculator 31d calculates luminance B of the front surface (support surface 17a and non-support surface 17b) of transport belt 17 based on image data 32a and stores the luminance as luminance data 32b.

Subsequently, wear determiner 31f determines whether or not transport belt 17 is degraded (ST14: degradation determining process). Specifically, wear determiner 31f determines whether or not luminance B of the front surface (support surface 17a and non-support surface 17b) of transport belt 17 exceeds a threshold value (determination criterion), based on luminance data 32b. In other words, wear determiner 31f is determiner that determines wear degree W (degradation state) of transport belt 17, based on luminance B (contrasting density of the image) of the front surface of transport belt 17 imaged by board recognition camera 14 (camera). Then, the determiner determines that transport belt 17 is degraded when the degradation state (wear degree W) of transport belt 17 exceeds a predetermined condition (threshold value).

Here, a relationship between wear degree W (horizontal axis) and luminance B (vertical axis) on support surface 17a of transport belt 17 is described with reference to FIG. 9. Luminance B of support surface 17a of transport belt 17 is increased from luminance B0 in an initial state in which wear degree W is zero, as the front surface is worn due to the time degradation. Wear determiner 31f determines that transport belt 17 is degraded when luminance B of support surface 17a exceeds luminance B1 as the threshold value, that is, wear degree W of support surface 17a exceeds wear degree W1 as the threshold value. Wear degree W1 as the threshold value is determined based on experiments or experience, in consideration of a relationship between wear degree W of transport belt 17 and slip degree when board 6 is transported.

Note that, in the wear determining process, the degradation of transport belt 17 may be determined, based on luminance difference ΔB between support surface 17a and non-support surface 17b. In this case, luminance calculator 31*d* calculates luminance difference ΔB between support surface 17*a* and non-support surface 17*b* from image data 32*a* and stores the calculated difference as luminance data 32*b*, and wear determiner 31*f* determines degradation, based on luminance difference ΔB of luminance data 32*b*. In an example in FIG. 9, since luminance B of non-support surface 17*b* is not changed from luminance B0, luminance difference ΔB as the threshold value is luminance difference ΔB1 (difference between B1 and B0).

In FIG. 8, in a case where it is determined that transport belt 17 is degraded in the degradation determining process (ST14) (YES), wear determiner 31*f* causes display 33 to perform notification of an indication that transport belt 17 is degraded and maintenance needs to be performed (ST15: notification process). In other words, display 33 is the notifier that performs notification of maintenance of transport belt 17 in the case where transport belt 17 is degraded. In a case where it is determined that transport belt 17 is not degraded in the degradation determining process (ST14) (NO), the wear determining process is ended and the next operation is performed. For example, in a case where the next operation is the component mounting operation, board 6 as the next mounting target is loaded and the component mounting operation is performed.

Next, in the wear determining process, a case where height sensor 15 recognizes region A of transport belt 17 will be described by focusing on a difference from the case of board recognition camera 14 described above is mainly described. In this case, in the recognizer moving process (ST12), height sensor 15 moves over region A. Then, in the recognition process (ST13), height calculator 31*e* calculates height H, based on measurement data of transport belt 17 including support surface 17*a*, which is measured by height sensor 15, and stores the height as height data 32*c*. Then, in the degradation determining process (ST14), wear determiner 31*f* determines whether or not height H of the front surface (support surface 17*a* and non-support surface 17*b*) of transport belt 17 exceeds the threshold value (determination criterion), based on height data 32*c*.

In other words, height sensor 15 is recognizer that measures height H of the front surface of transport belt 17. In addition, wear determiner 31*f* is determiner that determines wear degree W (degradation state) of transport belt 17, based on height H of the front surface of transport belt 17, which is measured by height sensor 15. Then, the determiner determines that transport belt 17 is degraded when the degradation state (wear degree W) of transport belt 17 exceeds a predetermined condition (threshold value).

Here, a relationship between wear degree W (horizontal axis) and height H (vertical axis) on support surface 17*a* of transport belt 17 is described with reference to FIG. 10. Height H of support surface 17*a* of transport belt 17 is decreased from height H0 in an initial state in which wear degree W is zero, as the front surface is worn due to the time degradation. Wear determiner 31*f* determines that transport belt 17 is degraded when height H of support surface 17*a* is lower than height H1 as the threshold value, that is, wear degree W of support surface 17*a* exceeds wear degree W1 as the threshold value.

Note that, in the wear determining process, the degradation of transport belt 17 may be determined, based on level difference ΔH between support surface 17*a* and non-support surface 17*b*. In this case, height calculator 31*e* calculates level difference ΔH between support surface 17*a* and non-support surface 17*b* and stores the calculated difference as height data 32*c*, and wear determiner 31*f* determines degradation, based on level difference ΔH of height data 32*c*. In an example in FIG. 10, since height H of non-support surface 17*b* is not changed from height H0, level difference ΔH as the threshold value is level difference ΔH1 (difference between H1 and H0).

In this manner, board recognition camera 14 or height sensor 15 is provided in mounting head 11, and is the recognizer that recognizes the state of the front surface of transport belt 17. Then, the recognizer recognizes the state of the front surface of transport belt 17 at a position (support surface 17*a*), which supports board 6, and at a position (non-support surface 17*b*), which does not support the board. Then, wear determiner 31*f* is the determiner that determines the degradation state of transport belt 17, based on the state of the front surface of transport belt 17 recognized by the recognizer, that is, the state of the front surface of transport belt 17 at the position which supports board 6 and the state of the front surface of transport belt 17 at the position which does not support board 6. Accordingly, it is possible to quantitatively monitor the wear state (degradation state) of transport belt 17 in the state in which the transport belt is installed in electronic component mounters M1 to M3.

Note that, as described above, the example, in which the recognizer (board recognition camera 14 or height sensor 15) recognizes the state of the surface of transport belt 17 in region A, is described; however, a position, at which the recognition is performed, is not limited to region A, and any position at which it is possible for the recognizer to recognize the state of the surface of transport belt 17 from above, may be set. Similarly, the recognizer also recognizes the state of the front surface of transport belt 17 on the other side and the degradation state of transport belt 17 is determined.

Next, a method (wear determining process) for determining the wear state (wear degree W) of transport belt 17 by electronic component mounting system 1 will be described by focusing on a difference from electronic component mounter M1 described above. In electronic component mounting system 1, in the recognition process (ST13), luminance data 32*b* or height data 32*c* stored in mounting storage 32 is transmitted to supervisory computer 3 and is stored as luminance data 42*a* or height data 42*b* in supervisory storage 42. Then, in the degradation determining process (ST14), it is determined whether or not luminance B or height H of transport belt 17 exceeds the threshold value (determination criterion), based on stored luminance data 42*a* or height data 42*b* by wear determiner 41*a* of supervisory controller 41. Then, in the notification process (ST15), wear determiner 41*a* causes display 44 of supervisory computer 3 to perform notification.

In other words, electronic component mounting system 1 includes the determiner (wear determiner 41*a* of supervisory controller 41) that determines the degradation state of transport belt 17, based on the state of the front surface of transport belt 17 recognized by the recognizer (board recognition camera 14 or height sensor 15). In addition, electronic component mounting system 1 includes the notifier (display 44 of supervisory computer 3) that performs notification of maintenance of transport belt 17 in a case where transport belt 17 is degraded.

As described above, electronic component mounters M1 to M3 of the exemplary embodiment include the board transporter (transport mechanism 5), which supports and transports board 6 by transport belt 17, the recognizer (board recognition camera 14 or height sensor 15), which recognizes the state of the front surface of transport belt 17, and the determiner (wear determiner 31*f*), which determines the degradation state (wear degree W) of transport belt 17 based on the state of the recognized front surface. In addition, electronic component mounting system 1 of exemplary embodiment includes electronic component mounters M1 to M3 and the determiner (wear determiner 41a), which determines the degradation state (wear degree W) of transport belt 17 based on the state of the recognized front surface. Accordingly, it is possible to quantitatively monitor the wear state of transport belt 17 in the state in which the transport belt is installed in electronic component mounters M1 to M3.

Note that, in order for the determination of the degradation state (wear degree W) to be more easily construed, it is possible to use following transport belt 17. For example, in the determination of the degradation state of transport belt 17 by board recognition camera 14, there may be used transport belt 17 that has a black front surface layer and a white inner layer which is provided under the front surface layer and is significantly different in luminance B from the front surface layer. The use of transport belt 17 makes it easy to determine the degradation state because there is a significant difference between luminance B obtained in a state in which the front surface layer is exposed with low degradation and luminance B obtained in a state in which the front surface layer is degraded and worn and the inner layer is exposed.

Hereinabove, the description is given based on the exemplary embodiment of the disclosure. It is understood by those skilled in the art that, it is possible to configure various modification examples of the exemplary embodiment by combining the configurational elements or the processes and such modification examples are included in the range of the disclosure.

In the exemplary embodiment of the disclosure described above, the wear state is monitored as the time degradation of the transport belt; however, in the following modification example, an electronic component mounting system in which tension reduction of the transport belt is monitored as time degradation. Repeated description with the exemplary embodiment of the disclosure described is omitted.

Press plate 21a on the upstream side, press plate 21b on the downstream side, and guide member 20 are not disposed above pulley 18 and drive pulley 19a. Therefore, it is possible to image the state of the front surface of transport belt 17 by board recognition camera 14 that moves over region C including pulley 18, which is shown in a circle of a two-dot chain line in FIG. 3B, or that moves above drive pulley 19a.

Figure 11A:
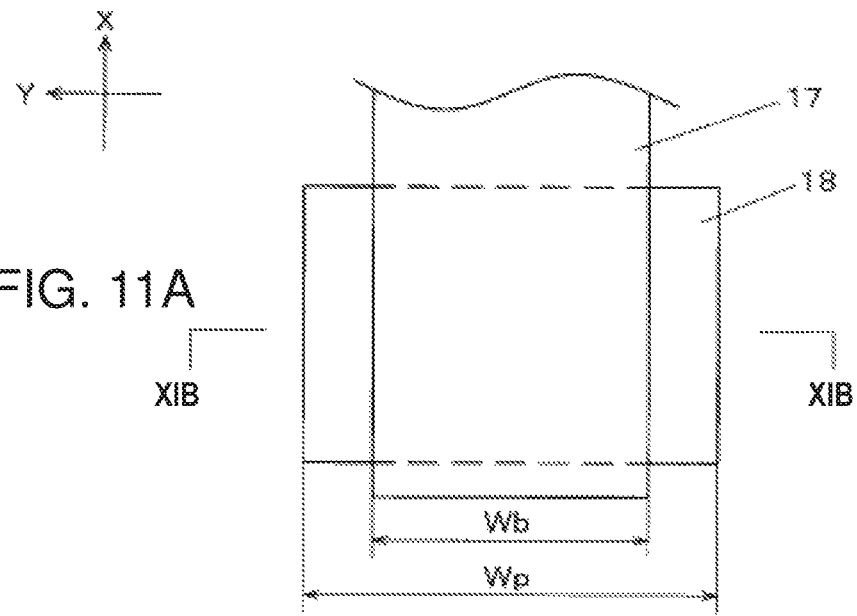
FIG. 11A is an enlarged plan view of the transport belt installed in the transport mechanism provided in the electronic component mounter of an exemplary embodiment of a modification example of the disclosure.
Figure 11B:
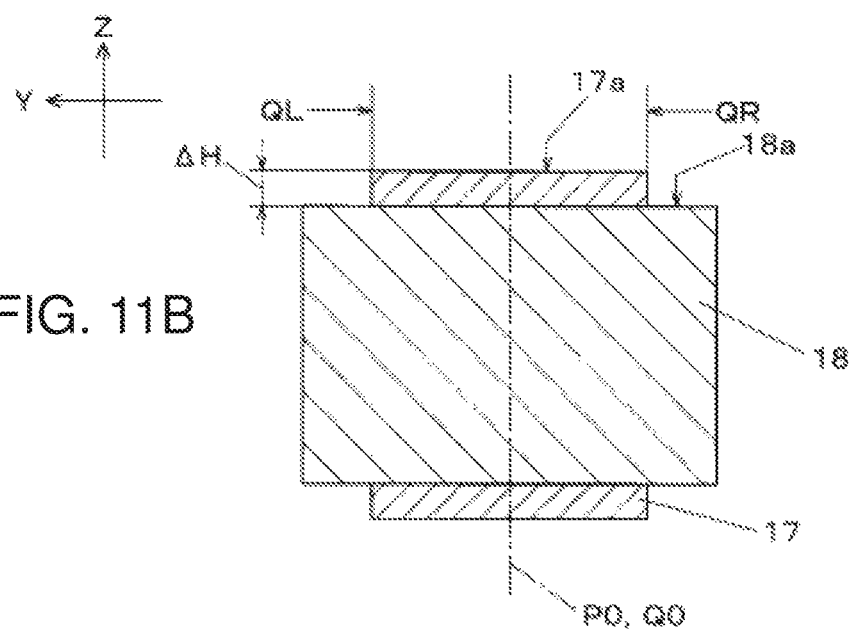
FIG. 11B is an enlarged sectional view of the transport belt installed in the transport mechanism provided in the electronic component mounter of the exemplary embodiment of the modification example of the disclosure.

FIG. 11A is an enlarged view of transport belt 17 including pulley 18 in region C illustrated in FIG. 3B. FIG. 11B illustrates a sectional view taken along line XIB-XIB illustrated in FIG. 11A. Width Wp (length in rotational axis direction) of pulley 18 is wider than width Wb of transport belt 17, and transport belt 17 is looped over pulley 18 such that center Q0 of the transport belt is substantially coincident with center P0 (midpoint in the Y direction) of pulley 18.

Since transport belt 17 on a side, on which the board is supported, is positioned above pulley 18 when viewed from mounting head 11, it is possible to find position P of right and left end portions QR and QL of transport belt 17 with pulley 18 as a reference. In other words, pulley 18 is a reference member that is positioned on a side far away from transport belt 17 and is viewed to project from transport belt 17, when viewed from mounting head 11 toward the lower side in the vertical direction. In other words, pulley 18, over which transport belt 17 is looped, is the reference member. In addition, level difference ΔH is formed by a thickness of transport belt 17 between front surface 18a of pulley 18 and front surface 17a of transport belt 17 on the side on which the board is supported.

Next, a control system of electronic component mounting system 1 will be described with reference to FIG. 12. Electronic component mounters M1 to M3 have the same configuration, and, here, electronic component mounter M1 is described. Electronic component mounter M1 includes mounting controller 31, mounting storage 32, transport mechanism 5, component supplier 7, mounting head 11, head moving mechanism 12, component recognition camera 13, board recognition camera 14, height sensor 15, display 33, and communicator 34. Mounting storage 32 stores various items of data such as image data 32a, boundary position data 32b, level-difference position data 32c, or traveling speed data 32d, as well as mounting operation parameters required for control of the configurational members by mounting controller 31.

Figure 12:
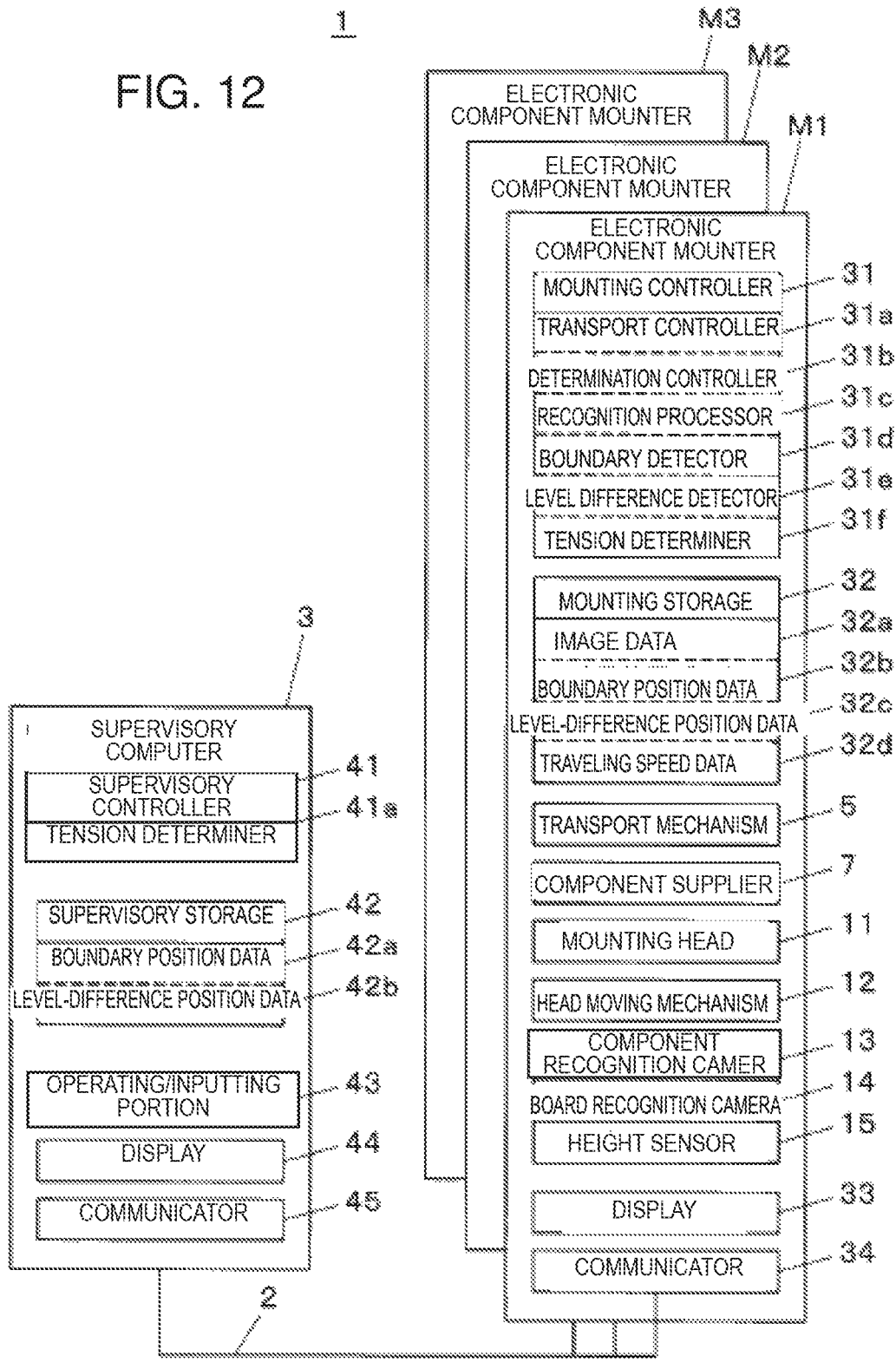
FIG. 12 is a block diagram illustrating a configuration of a control system of an electronic component mounting system of the exemplary embodiment of the modification example of the disclosure.

In FIG. 12, mounting controller 31 includes transport controller 31a as an internal processing function, determination controller 31b, recognition processor 31c, boundary detector 31d, level difference detector 31e, and tension determiner 31f. Mounting controller 31 controls the configurational members of component supplier 7, mounting head 11, and head moving mechanism 12, thereby performing component mounting operation of picking up a component from component supplier 7 so as to carry and place the component on board 6 positioned and held at the mounting operation position by transport mechanism 5.

Figure 13A:
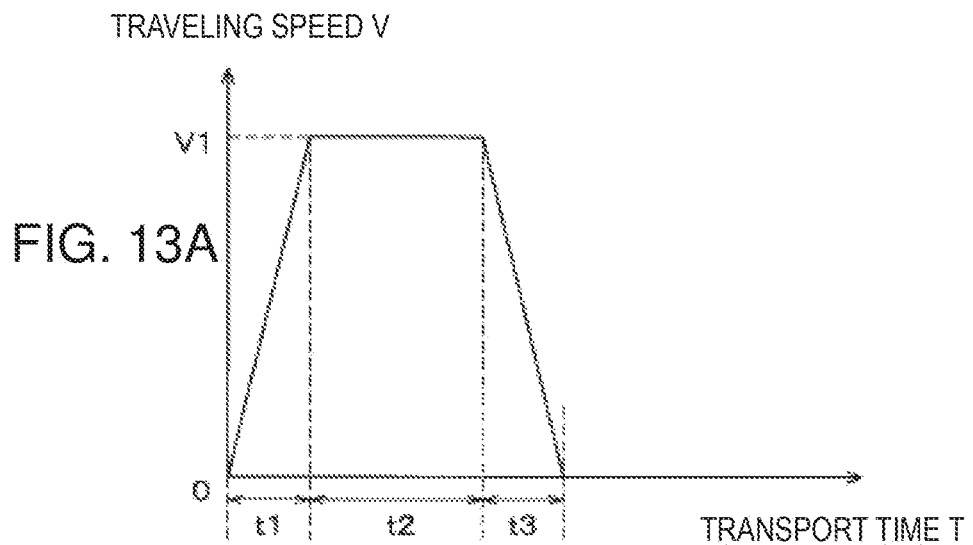
FIG. 13A is a diagram illustrating an example of a case where the transport belt has normal tension in a control pattern of a traveling speed when a board is transported in the transport mechanism provided in the electronic component mounter of the exemplary embodiment of the modification example of the disclosure.
Figure 13B:
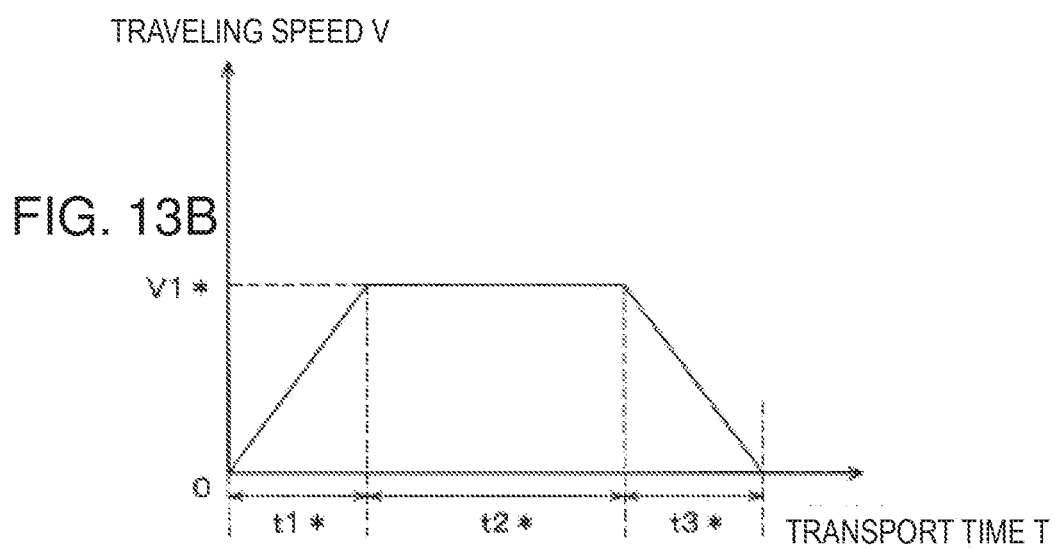
FIG. 13B is a diagram illustrating an example of a case where the transport belt has abnormal tension in the control pattern of the traveling speed when the board is transported in the transport mechanism provided in the electronic component mounter of the exemplary embodiment of the modification example of the disclosure.

Traveling speed data 32d is a control pattern of traveling speed V of transport belt 17, which is measured when transport mechanism 5 transports board 6. FIG. 13A is a graph illustrating an example of the control pattern of traveling speed V of transport belt 17, the vertical axis represents traveling speed V, and the horizontal axis represents transport time T. In this example, board 6 accelerates during time period t1 from a motionless state to traveling speed V1 at constant acceleration U (V1/t1), board 6 is transported at constant traveling speed V1 during time period t2, and board 6 decelerates during time period t3 from traveling speed V1 at constant acceleration U (−V1/t3) and stops. A type of board 6, which is transported, and a plurality of control pattern corresponding to a state of the tension of transport belt 17 are stored in traveling speed data 32d (for example, refer to control pattern used in a case where the tension is abnormal as illustrated in FIG. 13B).

Transport controller 31a controls transport mechanism 5 such that board 6 is loaded and held at the mounting operation position and is unloaded from the mounting operation position. When board 6 is transported and unloaded, transport controller 31a controls drive of transport motor 19 of transport mechanism 5, according to a control pattern of corresponding traveling speed V stored in traveling speed data 32d, thereby controlling traveling speed V of transport belt 17. In other words, transport controller 31a is a controller that controls traveling speed V of transport belt 17. Determination controller 31b collectively performs a tension determining process which will be described below.

Figure 14:
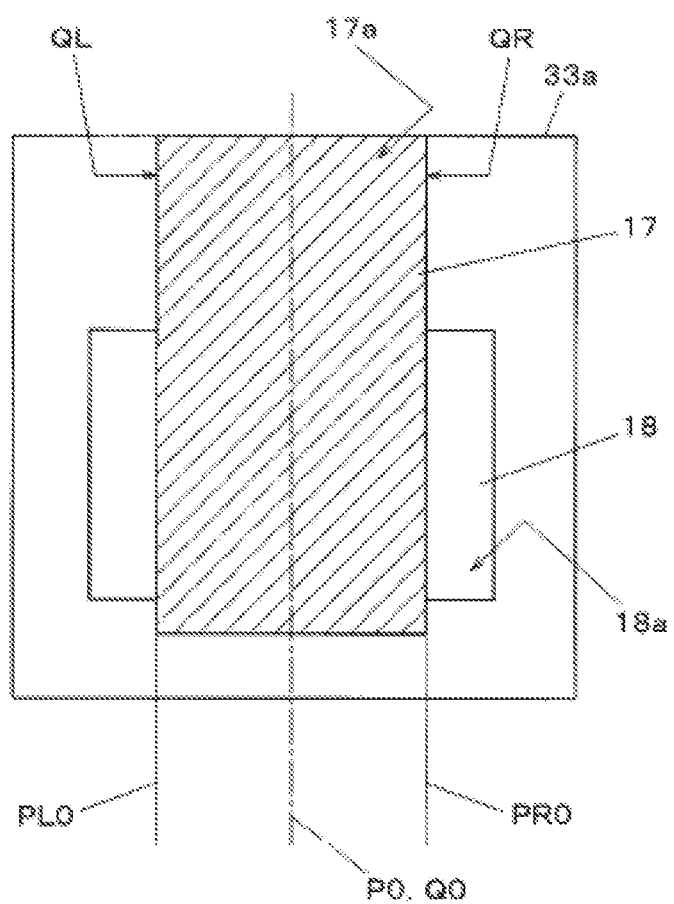
FIG. 14 is a view illustrating an example of an image of the transport belt installed in the transport mechanism, which is imaged by the board recognition camera provided in the electronic component mounter of the exemplary embodiment of the modification example of the disclosure.

Recognition processor 31c performs the recognition process on imaging data imaged by board recognition camera 13 and board recognition camera 14 and stores the processed data as image data 32a in mounting storage 32. Here, with reference to FIG. 7, there is provided description of an example of image data 32a of a state of the front surface of transport belt 17 including pulley 18 imaged by board recognition camera 14, which is displayed on display screen 33a of display 33. FIG. 14 is a captured image of region C illustrated in FIG. 3B.

FIG. 14 illustrates an example of a captured image (state of the front surface) of transport belt 17 having normal tension and transport belt 17 is looped over pulley 18 at a position at which center Q0 of the transport belt is coincident with center P0 of pulley 18. Hereinafter, positions P of left end QL and right end QR of transport belt 17 on pulley 18 in this state are referred to as left ideal position PL0 and right ideal position PR0, respectively. Since front surface 17a of transport belt 17 and front surface 18a of pulley 18 are different in reflectivity of light, the images of the surfaces captured by board recognition camera 14 are recognized as graphics having different luminance (contrasting density) from each other.

In FIG. 12, boundary detector 31d detects positions P (positions of boundaries) of left end QL and right end QR of transport belt 17 on pulley 18, based on the contrasting density of the image in stored image data 32a of transport belt 17 and the detected positions are stored as boundary position data 32b in mounting storage 32. Level-difference detector 31e detects level difference ΔH between pulley 18 and left end QL or right end QR of transport belt 17, based on a measurement result of front surface 17a of transport belt 17 and front surface 18a of pulley 18 measured by height sensor 15, and positions P (positions of level difference) on pulley 18 are stored as level-difference position data 32c in mounting storage 32.

Figure 15:
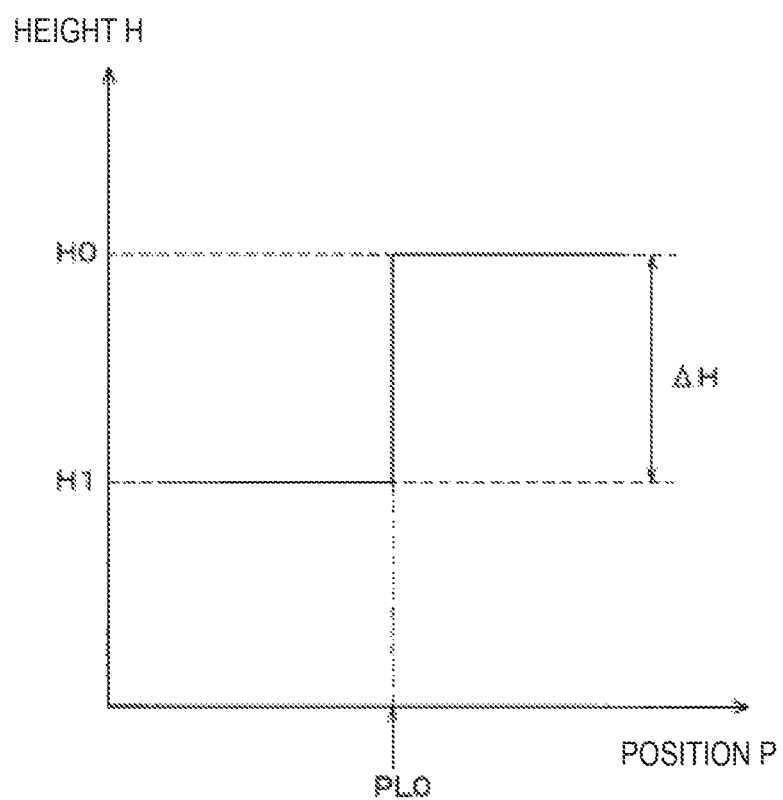
FIG. 15 is a diagram illustrating an example of a result obtained by measuring, using the height sensor, the front surface of the transport belt installed in the transport mechanism provided in the electronic component mounter of the exemplary embodiment of the modification example of the disclosure.

Here, with reference to FIG. 15, level difference ΔH between pulley 18 and transport belt 17, which is detected by level difference detector 31e, is described. FIG. 15 is a graph illustrating a measured result of the vicinity of left end QL of transport belt 17 in region A illustrated in FIG. 3B by height sensor 15, in which the horizontal axis represents a position P on pulley 18, and the vertical axis represents height H. When viewed from left to right along the horizontal axis, height H measured by height sensor 15 is changed from height H1 of front surface 18a of pulley 18 to height H0 of front surface 17a of transport belt 17 at ideal position PL0 of the left end. In other words, level difference ΔH (H0−H1) is found in ideal position PL0 of the left end. Level difference detector 31e stores positions P of level difference ΔH as level-difference position data 32c.

In FIG. 12, tension determiner 31f performs the tension determining process of determining whether the tension of transport belt 17, which is looped over pulley 18, is normal or abnormal (lower than a predetermined value), based on positions P of ends QL and QR of transport belt 17 on pulley 18 in boundary position data 32b or level-difference position data 32c stored in mounting storage 32.

Specifically, tension determiner 31f obtains range R in which positions P of ends QL and QR of transport belt 17 are present, in a state in which transport belt 17 travels without board 6 loaded thereon. When transport belt 17 elongates due to the time degradation and the tension of transport belt 17, which is looped over pulley 18, is lowered, transport belt 17 meanders when traveling, and range R of ends QL and QR is expanded. Hence, tension determiner 31f determines that the tension of transport belt 17 is abnormal when range R of ends QL and QR or positions P of ends QL and QR exceeds the threshold value (predetermined range). In addition, when tension determiner 31f determines that tension is abnormal, the tension determiner causes display 33 to perform notification of an indication that maintenance such as replacement of transport belt 17 needs to be performed. Note that tension determiner 31f may cause an indicating lamp, a buzzer, or the like (not illustrated) to perform notification.

In FIG. 12, display 33 is a display device such as a liquid crystal panel and displays information or the like indicating the maintenance of transport belt 17, of which an operator is notified, as well as various items of data such as image data 32a, boundary position data 32b, level-difference position data 32c, or traveling speed data 32d. Communicator 34 is a communication interface and transmits and receives a signal or data to and from supervisory computer 3 via communication network 2.

In FIG. 12, supervisory computer 3 includes supervisory controller 41, supervisory storage 42, operating/inputting portion 43, display 44, and communicator 45. Supervisory controller 41 is an arithmetic device such as a CPU, and includes an internal processor such as tension determiner 41a. Supervisory storage 42 is a storage device, and stores boundary position data 42a, level-difference position data 42b, or the like, as well as the electronic component mounting data that is used to collectively control electronic component mounting system 1.

Operating/inputting portion 43 is an inputting device such as a keyboard, a touch panel, or a mouse, and is used when an operating command or data is input. Display 44 is a display device such as a liquid crystal panel and displays information or the like indicating the maintenance of transport belt 17, of which an operator is notified, as well as various items of data such as boundary position data 42a or level-difference position data 42b. Communicator 45 is a communication interface and transmits and receives a signal or data to and from electronic component mounters M1 to M3 via communication network 2.

Boundary position data 42a stored in supervisory storage 42 is the same as boundary position data 32b stored in mounting storage 32 of electronic component mounters M1 to M3, and is transmitted by boundary detector 31d. Level-difference position data 42b stored in supervisory storage 42 is the same as level-difference position data 32c stored in mounting storage 32 of electronic component mounters M1 to M3, and is transmitted by level difference detector 31e.

Tension determiner 41a performs the same tension determining process as tension determiner 31f of electronic component mounters M1 to M3. Tension determiner 41a determines whether the tension of transport belt 17, which is looped over pulley 18, is normal or abnormal, based on positions P of ends QL and QR of transport belt 17 on pulley 18 in boundary position data 42a or level-difference position data 42b stored in supervisory storage 42. In addition, when tension determiner 41a determines that the tension of transport belt 17 is abnormal, the tension determiner causes display 44 to perform notification of an indication that maintenance such as replacement of transport belt 17 needs to be performed. Note that tension determiner 41a may cause an indicating lamp, a buzzer, or the like (not illustrated) to perform notification.

Next, a method (tension determining process) for determining the tension of transport belt 17 by electronic component mounting system 1 or electronic component mounters M1 to M3 is descried in accordance with a flow in FIG. 16, with reference to FIGS. 13A, 13B, 17A, 17B, and 18. The component mounting method performed by electronic component mounting system 1 and the component mounting method performed by electronic component mounters M1 to M3 are the same except that the component mounting methods are performed by different configuration members of the controller (tension determiner 41a or tension determiner 31f) and the notifier (display 44 or display 33).

Hereinafter, the tension determining process by electronic component mounter M1 will be described.

The tension determining process is performed at a predetermined time after manufacturing of a predetermined number of mounting boards, in a state in which board 6 is not loaded on transport belt 17, that is, after the board is unloaded. Board recognition camera 14 or height sensor 15 (recognizer) is used in the tension determining process. Hereinafter, an example, in which board recognition camera 14 recognizes left end QL of transport belt 17 in region A of transport belt 17 illustrated in FIG. 3B and it is determined whether the tension of transport belt 17 is normal or abnormal, will be described. In addition, in the component mounting operation performed before the tension determining process which will be described below, board 6 is loaded or unloaded in response to a control pattern of traveling speed V1 illustrated in FIG. 13A.

In the tension determining process, first, determination controller 31b controls head moving mechanism 12 such that board recognition camera 14 moves over region C of transport belt 17 as recognition target (ST21: recognizer moving process). Subsequently, transport controller 31a controls transport mechanism 5 such that transport belt 17 travels (ST22).

In (ST22), traveling speed V of transport belt 17 is set to be equal to or higher than traveling speed V1 of the control pattern used when board 6 is loaded or unloaded in the component mounting operation.

Subsequently, board recognition camera 14 performs recognition of the state of the surface of transport belt 17 including pulley 18 (ST23: recognition process). Specifically, recognition processor 31c performs the recognition process on the imaging data of transport belt 17 including pulley 18 imaged by board recognition camera 14 and stores the processed imaging data as image data 32a. In other words, board recognition camera 14 (camera) is the recognizer that images the state of the front surface of traveling transport belt 17 and the state of the front surface of pulley 18 (reference member). Subsequently, boundary detector 31d detects position P of left end QL of transport belt 17 on pulley 18 based on image data 32a and stores the detected position as boundary position data 32b.

Subsequently, tension determiner 31f determines whether or not the tension of transport belt 17, which is looped over pulley 18, is normal or abnormal (ST24: tension determining process). Specifically, tension determiner 31f determines whether or not region R, in which position P of left end QL of transport belt 17 is present, exceeds a threshold value (determination criterion), based on boundary position data 32b. In other words, tension determiner 31f is the determiner that determines whether the tension of transport belt 17 is normal or abnormal, based on contrasting density (difference of luminance) of the image of the front surface of traveling transport belt 17 and the front surface of pulley 18 (reference member) imaged by board recognition camera 14 (camera). Then, the determiner determines that the tension of transport belt 17 is abnormal (decreased by exceeding a permissible range) when range R or position P of end QL of transport belt 17 exceeds a predetermined condition (threshold value).

Figure 17A:
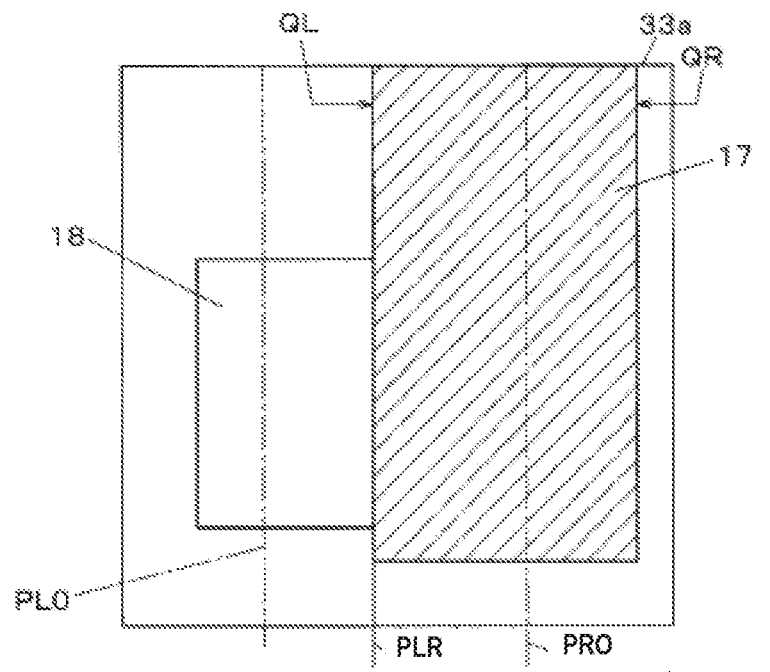
FIG. 17A is a diagram illustrating an example of an image of the transport belt having abnormal tension, which is imaged by the board recognition camera provided in the electronic component mounter of the exemplary embodiment of the modification example of the disclosure.
Figure 17B:
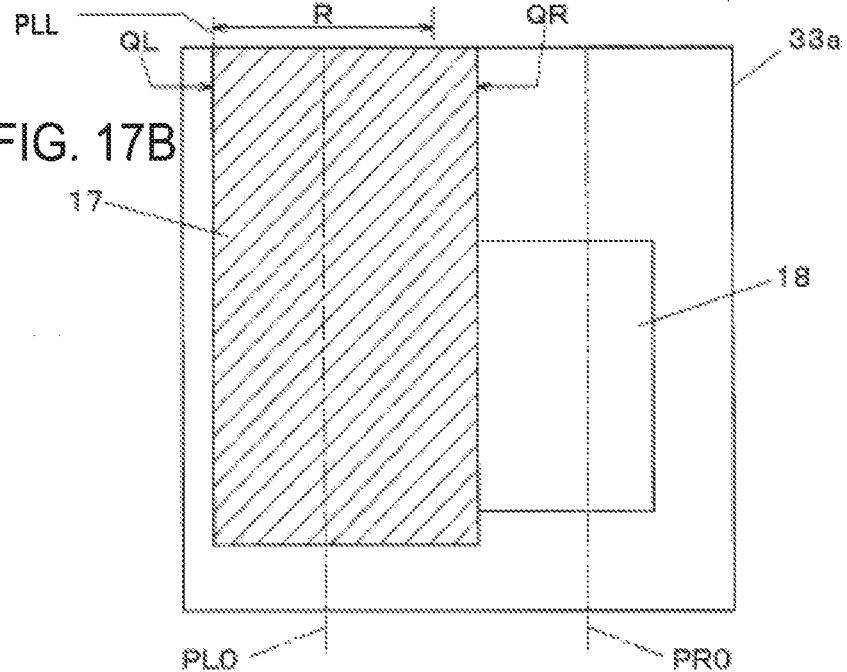
FIG. 17B is a diagram illustrating an example of an image of the transport belt having abnormal tension, which is imaged by the board recognition camera provided in the electronic component mounter of the exemplary embodiment of the modification example of the disclosure.

Here, with reference to FIGS. 17A and 17B, an example, in which the tension is lowered, and thereby board recognition camera 14 images transport belt 17 that meanders to right and left (Y direction) when traveling, is described. FIG. 17A illustrates a captured image of a state in which transport belt 17 meanders to be close to the far right side (position PLR) toward display screen 33a, and FIG. 17B illustrates a captured image of a state in which the transport belt is close to the far left side (position PLL). When traveling transport belt 17 is continually imaged, position P of left end QL of transport belt 17 is dispersed between position PLR and position PLL with ideal position PL0 interposed therebetween (range R).

Tension determiner 31f determines that the tension is abnormal in a case where position P of left end QL of transport belt 17 exceeds predetermined position P (threshold value) of position PLR at the right end or position PLL at the left end, or in a case where position P exceeds predetermined range R (threshold value). The threshold value (predetermined position P or predetermined range R) is determined in association with traveling speed V of transport belt 17 in the recognition process (ST23), based on experiments or experience. In addition, the threshold value is determined in consideration of a risk or the like of straying of transport belt 17 from pulley 18 due to reduction of the service life or the tension because of elongation of transport belt 17.

In this manner, in the tension determining process (ST24), determination of the tension of traveling transport belt 17 is performed. Accordingly, in transport mechanism 5 having a structure in which the tension of transport belt 17, which is looped over pulley 18 is changed between the motionless state and the traveling state of transporting board 6, it is also possible to detect abnormality in the tension of transport belt 17 in a state in accordance with actuality. In addition, when board recognition camera 14 (recognizer) recognizes the state of the front surface of traveling transport belt 17 and the state of the front surface of pulley 18 (reference member), by making traveling speed V of transport belt 17 higher than traveling speed V1 at which board 6 is transported, it is possible to achieve the following effects. In other words, the abnormality in the tension of transport belt 17 is detected in stricter conditions, and thereby it is possible to improve accuracy of detection of the abnormality in the tension of transport belt 17.

In FIG. 16, in a case where it is determined that the tension of transport belt 17 is abnormal in the tension determining process (ST24) (YES), tension determiner 31f causes display 33 to perform notification of an indication that the tension of transport belt 17 is lowered to be abnormal and the maintenance needs to be performed (ST25: notification process).

In other words, display 33 is the notifier that performs notification of the maintenance of transport belt 17 in the case where the tension of transport belt 17 is abnormal. Subsequently, determination controller 31b changes the control pattern of traveling speed V at the time of loading and unloading of board 6 in the board mounting operation, into a control pattern in which the traveling speed V is lowered, further than in a case where the tension of transport belt 17 is normal (ST26: traveling speed changing process).

FIG. 13B illustrates an example of a control pattern used at the time of abnormal tension in which traveling speed V is lowered. The control pattern for the tension abnormality is changed in the following examples, compared to the control pattern (FIG. 13A) used at the time of normal tension.

In other words, compared to when the tension is normal, traveling speed V1* at the time of constant speed traveling is lowered. Further, time period t1* of accelerating and time period t3* of decelerating are increased, and thus acceleration $U^*(V1^*/t1^*)$ during accelerating, and deceleration $U^*(-V1^*/t3^*)$ during accelerating, are lowered. In addition, time period t2* of constant speed traveling is increased, and thus transport distance of board 6 is set to be the same.

In FIG. 16, when the control pattern of traveling speed V of transport belt 17 is changed to a pattern for abnormal tension in the traveling speed changing process (ST26), board 6 is transported (loaded or unloaded) by the control pattern of traveling speed V1* of which traveling speed V is reduced more than traveling speed V1 for the time of normal tension. In other words, in a case where the tension of transport belt 17 is abnormal, transport controller 31a (controller) reduces traveling speed V of transport belt 17 that transports board 6. Accordingly, after it is determined that the tension of transport belt 17 is abnormal (YES in ST24), it is possible to prevent a defect such as escaping of transport belt 17 and it is possible to continue the component mounting operation, until an operator causes the maintenance to be executed.

In a case where it is determined that the tension of transport belt 17 is not abnormal (normal) (NO) in the degradation determining process (ST 24), the tension determining process is ended and the next operation is performed. For example, in a case where the next operation is the component mounting operation, board 6 as the mounting target is loaded and the component mounting operation is continued. In this case, traveling speed V of transport belt 17 at the time of loading or unloading of board 6 is not changed from a speed at the time of normal tension (traveling speed V1).

Next, in the tension determination process, a case where height sensor 15 recognizes left end QL of transport belt 17 in region A of transport belt 17 will be described by focusing on a difference from the case of board recognition camera 14 described above. In this case, in the recognizer moving process (ST21), height sensor 15 moves over region A. Then, in the recognition process (ST23), level difference detector 31e detects position P of level difference ΔH between left end QL of transport belt 17 and pulley 18, based on measurement data of height H of front surface 17a of transport belt 17 and front surface 18a of pulley 18, which is measured by height sensor 15, and position P of level difference ΔH is stored as level-difference position data 32c. Then, in the tension determining process (ST24), tension determiner 31f determines whether or not range R or position P of end QL of transport belt 17 exceeds the threshold value (determination criterion), based on level-difference position data 32c.

In other words, height sensor 15 is the recognizer that measures height H of the front surface of traveling transport belt 17 and the front surface of pulley 18 (reference member). In addition, tension determiner 31f is the determiner that determines whether the tension of transport belt 17 is normal or abnormal, based on height H of the front surface of traveling transport belt 17 and the front surface of pulley 18 (reference member), which are measured by height sensor 15. Then, the determiner determines that the tension of transport belt 17 is abnormal when range R or position P of end QL of transport belt 17 exceeds a predetermined condition (threshold value).

Figure 18:
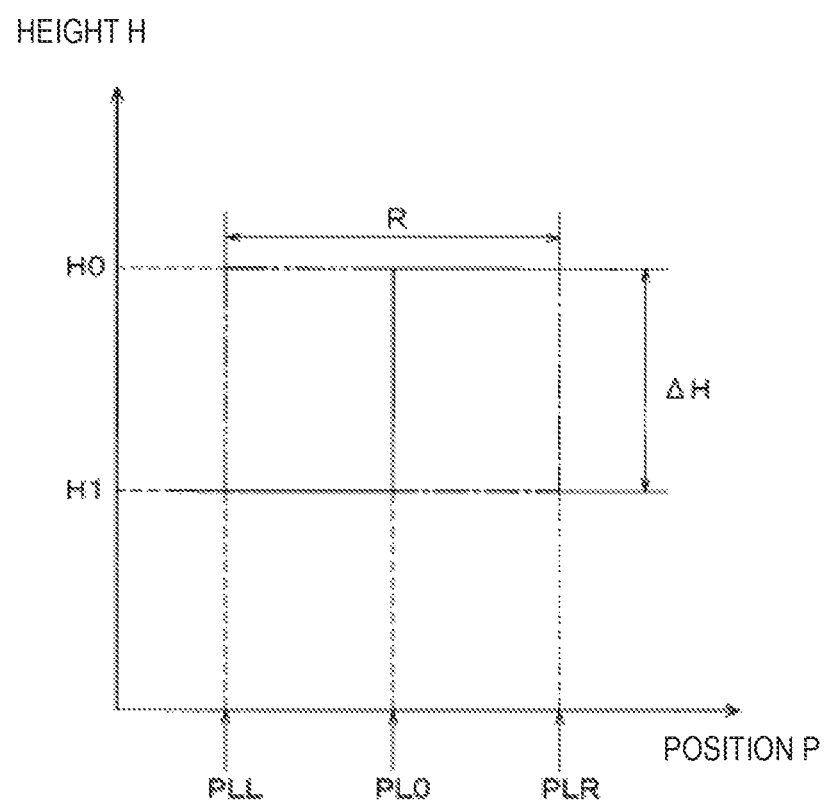
FIG. 18 is a diagram illustrating an example of measurement result of the transport belt having abnormal tension, which is measured by the height sensor provided in the electronic component mounter of the exemplary embodiment of the modification example of the disclosure.

Here, FIG. 18 is a graph illustrating a measurement result of the vicinity of left end QL of transport belt 17 meandering when traveling due to reduction of the tension, measured by height sensor 15, and the graph is formed of a position P (horizontal axis) and height H (vertical axis) on pulley 18. Position P, at which height H measured by height sensor 15 is changed from height H0 of front surface 17a of transport belt 17 to height H1 of front surface 18a of pulley 18, becomes position P of left end QL of transport belt 17. Transport belt 17 meanders, and thereby swings to right and left, thus, position P of left end QL of transport belt 17 is also dispersed from right PLR in one-dot chain line to left end PLL in two-dot chain line (range R).

Tension determiner 31f determines that the tension is abnormal, in a case where position P of left end QL of transport belt 17 exceeds the predetermined position (threshold value), or in a case where position P of left end QL exceeds predetermined range R (threshold value).

In this manner, board recognition camera 14 or height sensor 15 are provided in mounting head 11 and are the recognizer that recognizes the state of the front surface of traveling transport belt 17 and the state of the front surface of pulley 18 (reference member). In other words, the recognizer recognizes the position of end QL of transport belt 17 with pulley 18 (reference member) as the reference. Then, tension determiner 31f is the determiner that determines whether the tension of transport belt 17 is normal or abnormal, based on the state of the front surface of transport belt 17 and the state of the front surface of pulley 18 (reference member), which are recognized by the recognizer. In other words, the determiner determines whether the tension of transport belt 17 is normal or abnormal, based on the position of end QL of the transport belt, which is recognized by the recognizer. Accordingly, it is possible to quantitatively monitor the tension of transport belt 17, which is looped over pulley 18 without using the dedicated sensor for measuring the tension.

Note that, as described above, the example, in which the recognizer (board recognition camera 14 or height sensor 15) recognizes left end QL of transport belt 17 in region A, is described; however, the recognizer may recognize right end QR. In addition, a recognition position is not limited to transport belt 17 including pulley 18, and may be transport belt 17 including drive pulley 19a. Further, the recognition position is not limited to pulley 18 or drive pulley 19a, the recognition position may be a position at which it is possible to recognize the state of the front surface of transport belt 17 from above by the recognizer, and at which the reference member by which the positions of ends QL and QR of transport belt 17 can be recognized is present below transport belt 17. Similarly, the recognizer also recognizes the state of the front surface of transport belt 17 on the other side and it is determined whether the tension of transport belt 17, which is looped over pulley 18, is normal or abnormal.

Next, a method (tension determining process) for determining the tension of transport belt 17 by electronic component mounting system 1 will be described by focusing on a difference from electronic component mounter M1 described above. In electronic component mounting system 1, in the recognition process (ST23), boundary position data 32b or level-difference position data 32c stored in mounting storage 32 is transmitted to supervisory computer 3 and is stored as boundary position data 42a or level-difference position data 42b in supervisory storage 42. Then, in the tension determining process (ST24), it is determined whether or not range R or position P of end QL of transport belt 17 exceeds the threshold value (determination criterion), based on boundary position data 42a or level-difference position data 42b stored in tension determiner 41a of supervisory controller 41. Then, in the notification process (ST25), tension determiner 41a causes display 44 of supervisory computer 3 to perform notification.

In other words, electronic component mounting system 1 includes the determiner (tension determiner 41a of supervisory controller 41) that determines whether the tension of transport belt 17 is normal or abnormal, based on the state of the front surface of traveling transport belt 17 and the state of the front surface of pulley 18 (reference member) recognized by the recognizer (board recognition camera 14 or height sensor 15). In addition, electronic component mounting system 1 includes the notifier (display 44 of supervisory computer 3) that performs notification of maintenance of transport belt 17 in a case where the tension of transport belt 17 is abnormal.

As described above, electronic component mounters M1 to M3 of the exemplary embodiment include the board transporter (transport mechanism 5), which supports and transports board 6 by transport belt 17, the reference member (pulley 18) that is positioned on a side far away from transport belt 17 and is viewed to project from transport belt 17 when viewed from mounting head 11 in the vertical direction, the recognizer (board recognition camera 14 or height sensor 15), which recognizes the state of the front surface of traveling transport belt 17 and the state of the front surface of the reference member, and the determiner (tension determiner 31f), which determines whether the tension of transport belt 17 is normal or abnormal, based on the state of the recognized front surface. In addition, electronic component mounting system 1 of exemplary embodiment includes electronic component mounters M1 to M3, and determiner (tension determiner 41a) that determines whether the tension of transport belt 17 is normal or abnormal, based on the state of the recognized front surface. Accordingly, it is possible to quantitatively monitor the tension of traveling transport belt 17, without using the dedicated sensor for measuring the tension.

Electronic component mounter and electronic component mounting system of the disclosure have an effect that it is possible to monitor time degradation of a transport belt in a state in which the transport belt is installed in the electronic component mounter, and are applicable to a component mounting field in which component is mounted on a board.

What is claimed is:

1. An electronic component mounter having a mounting head that mounts an electronic component on a board, the electronic component mounter comprising:
   a board transporter that transports the board with a transport belt supporting the board;
   a recognizer for recognizing a state of a front surface of the transport belt, the recognizer being provided in the mounting head; and
   a determiner for determining a degradation state of the transport belt based on the state of the front surface of the transport belt recognized by the recognizer.

2. The electronic component mounter of claim 1,
   wherein the recognizer recognizes the state of the front surface of the transport belt both at a position at which the board is supported and at a position at which the board is not supported, and
   wherein the determiner determines the degradation state of the transport belt based on the state of the front surface of the transport belt at the position at which the board is supported and the state of the front surface at the position at which the board is not supported.

3. The electronic component mounter of claim 1,
   wherein the recognizer is a camera that images the state of the front surface of the transport belt, and
   wherein the determiner determines the degradation state of the transport belt based on contrasting density of an image of the front surface of the transport belt imaged by the camera.

4. The electronic component mounter of claim 1,
   wherein the recognizer is a height sensor that measures a height of the front surface of the transport belt, and
   wherein the determiner determines the degradation state of the transport belt based on the height of the front surface of the transport belt measured by the height sensor.

5. The electronic component mounter of claim 1, further comprising: a notifier that notifies maintenance of the transport belt in a case where the transport belt is degraded.

6. The electronic component mounter of claim 1,
   wherein the mounting head further includes a nozzle that blasts, with air, to the front surface of the transport belt, which is recognized, before the recognizer recognizes the state of the front surface of the transport belt.

7. An electronic component mounting system comprising:
   an electronic component mounter having a mounting head that mounts an electronic component on a board,
   wherein the electronic component mounter includes
      a board transporter that transports the board with a transport belt supporting the board;
      a recognizer for recognizing a state of a front surface of the transport belt, the recognizer being provided in the mounting head; and
      a determiner for determining a degradation state of the transport belt based on the state of the front surface of the transport belt recognized by the recognizer.

8. The electronic component mounting system of claim 7,
   wherein the recognizer recognizes the state of the front surface of the transport belt both at a position at which the board is supported and at a position at which the board is not supported, and
   wherein the determiner determines the degradation state of the transport belt based on the state of the front surface of the transport belt at the position at which the board is supported and the state of the front surface at the position at which the board is not supported.

9. The electronic component mounting system of claim 7,
   wherein the recognizer is a camera that images the state of the front surface of the transport belt, and
   wherein the determiner determines the degradation state of the transport belt based on contrasting density of an image of the front surface of the transport belt imaged by the camera.

10. The electronic component mounting system of claim 7,
    wherein the recognizer is a height sensor that measures a height of the front surface of the transport belt, and
    wherein the determiner determines the degradation state of the transport belt based on the height of the front surface of the transport belt measured by the height sensor.

11. The electronic component mounting system of claim 7, further comprising:
    a notifier that notifies maintenance of the transport belt in a case where the transport belt is degraded.

12. The electronic component mounting system of claim 7,
    wherein the mounting head further includes a nozzle that blasts, with air, to the front surface of the transport belt, which is recognized, before the recognizer recognizes the state of the front surface of the transport belt.

* * * * *